(12) United States Patent
Terasawa et al.

(10) Patent No.: US 6,927,641 B2
(45) Date of Patent: Aug. 9, 2005

(54) OSCILLATOR AND ELECTRONIC DEVICE USING THE SAME

(75) Inventors: Katsuyoshi Terasawa, Nagano-ken (JP); Manabu Oka, Nagano-ken (JP)

(73) Assignee: Seiko Epson Corporation (JP)

( * ) Notice: Subject to any disclaimer, the term of this patent is extended or adjusted under 35 U.S.C. 154(b) by 348 days.

(21) Appl. No.: 10/281,889

(22) Filed: Oct. 28, 2002

(65) Prior Publication Data

US 2003/0098749 A1 May 29, 2003

(30) Foreign Application Priority Data

| Nov. 2, 2001 | (JP) | 2001-338044 |
| Mar. 11, 2002 | (JP) | 2002-066132 |
| Sep. 26, 2002 | (JP) | 2002-280919 |

(51) Int. Cl.[7] ............................................. H03B 5/02
(52) U.S. Cl. ............ 331/158; 331/116 R; 331/166 FE; 331/185; 331/74
(58) Field of Search ............................. 331/158, 116 R, 331/116 FE, 74, 185, 109

(56) References Cited

U.S. PATENT DOCUMENTS 6,166,609 A  * 12/2000 Nakamiya et al. .......... 331/109

FOREIGN PATENT DOCUMENTS

| JP | 03-103614 | 4/1991 |
| JP | 03-262322 | 11/1991 |
| JP | 04-167615 | 6/1992 |
| JP | 07-154146 | 6/1995 |
| JP | 2001-156547 | 6/2001 |
| JP | 2001-196915 | 7/2001 |

* cited by examiner

Primary Examiner—Arnold Kinkead
(74) Attorney, Agent, or Firm—Harness, Dickey & Pierce, P.L.C.

(57) ABSTRACT

An oscillation signal that is provided from an inverter-type oscillation circuit 4 is input to an output driving circuit 5. In the output driving circuit 5, a control circuit 53 controls a voltage control circuit 52 and a buffer circuit 51 in accordance with control data written in a memory circuit 54, to generate a clock signal with control data amplitude, duty ratio, rising/falling characteristics of an output waveform in accordance with the control data. The output driving circuit 5 is configured with a plurality of voltage control circuits and a plurality of buffer circuits to allow clock signals, each having different waveform characteristics, to be provided from a plurality of output terminals.

9 Claims, 20 Drawing Sheets

[FIG. 1]
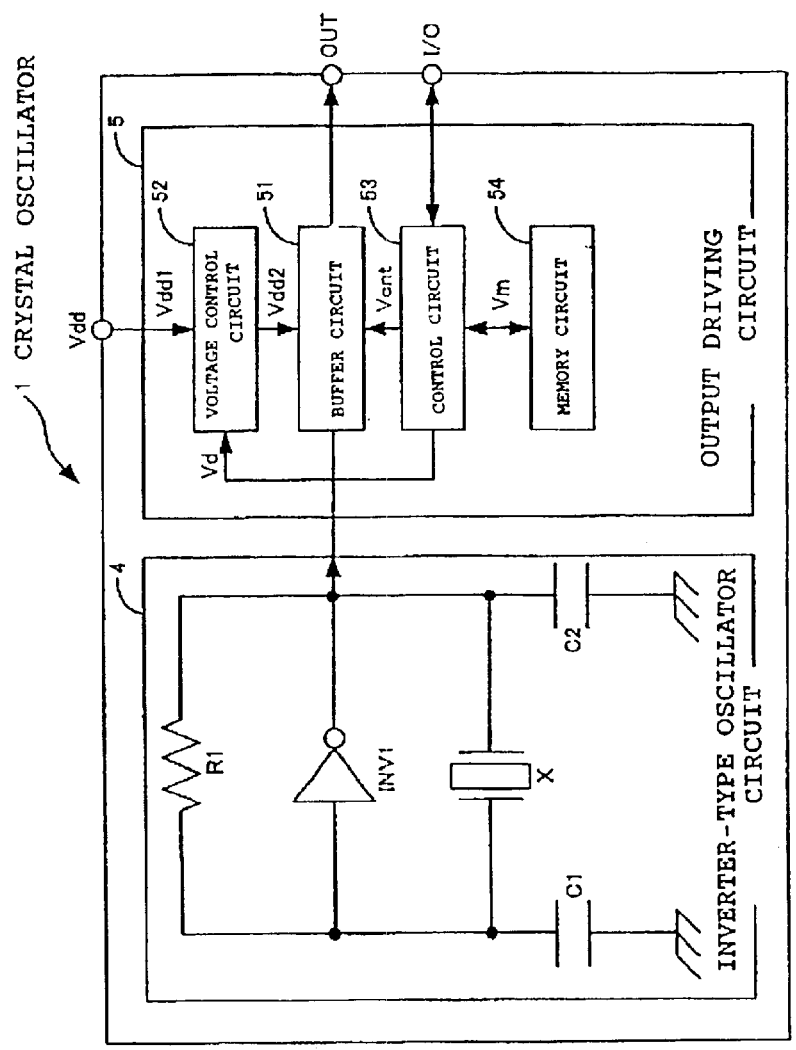

[FIG. 2]
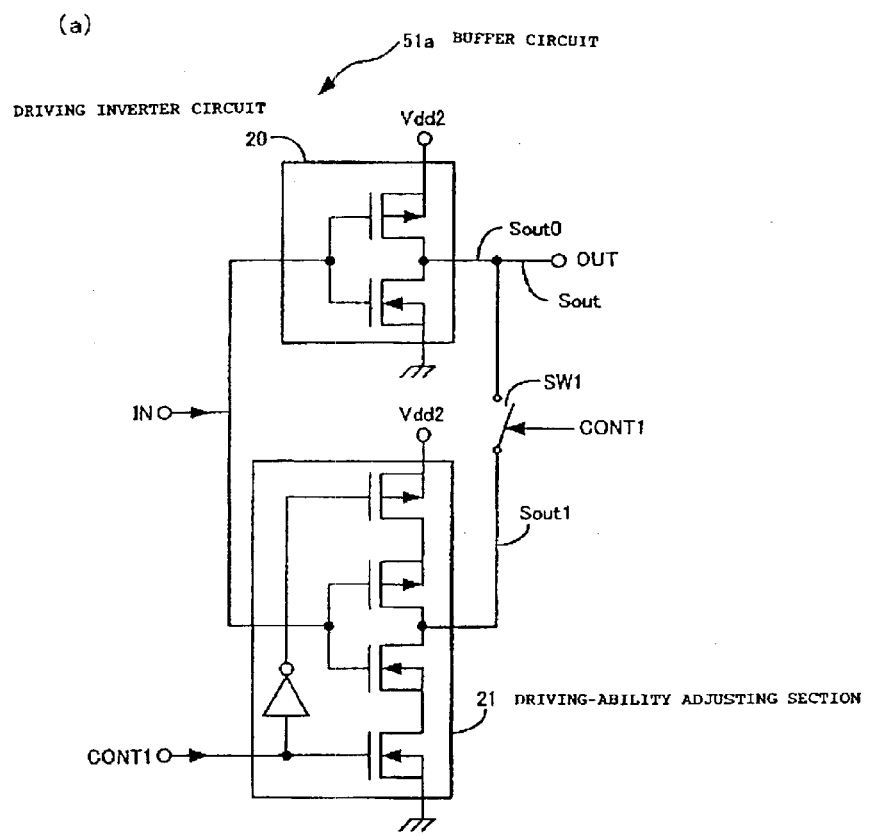

[FIG. 3]
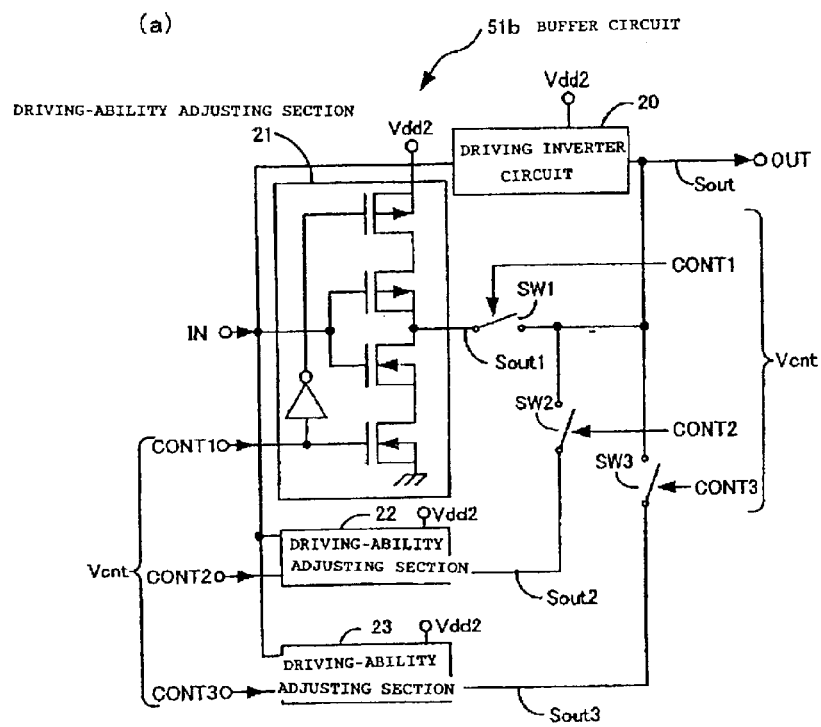

[FIG. 4]
(a)
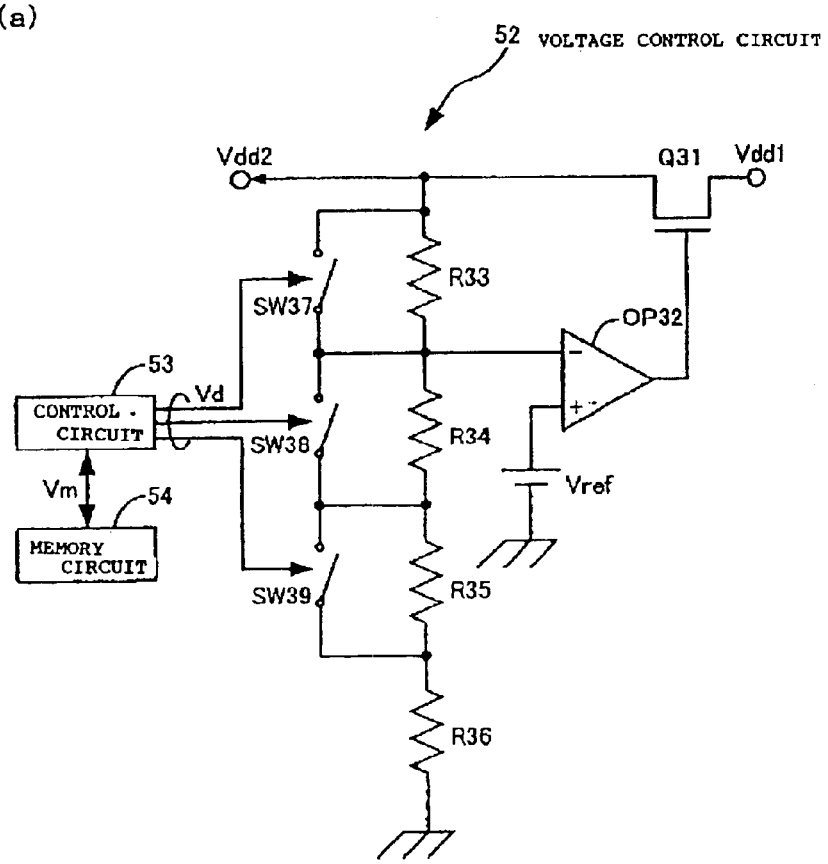
(b)
| SW37 | SW38 | SW39 | Vdd2 |
|---|---|---|---|
| ON | — | — | 1Vref=1V |
| OFF | ON | OFF | 3/2Vref=1.5V |
| OFF | ON | ON | 2Vref=2V |
R indicates each resistance
"—" indicates either ON or OFF switch state is acceptable

[FIG. 5]
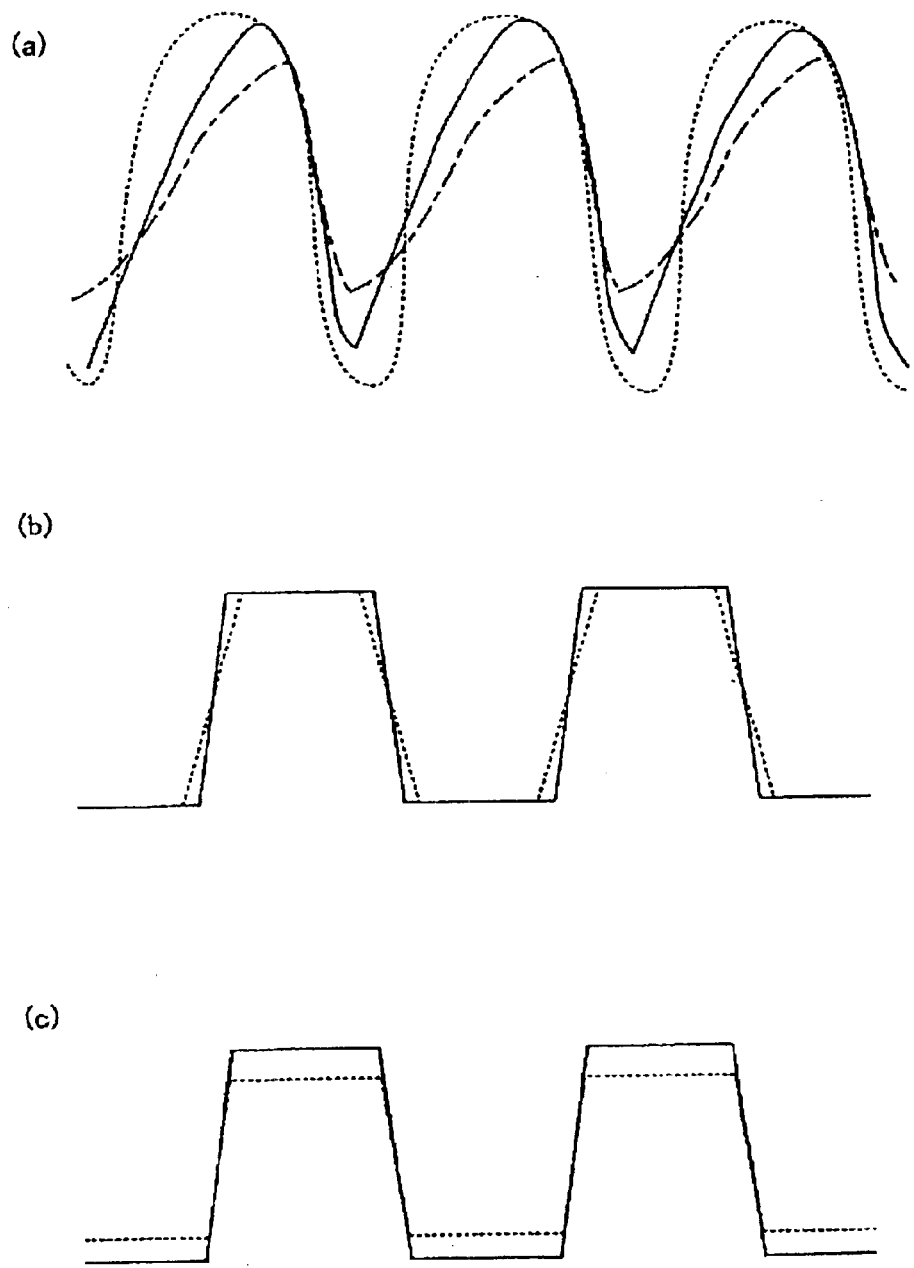

[FIG. 6]
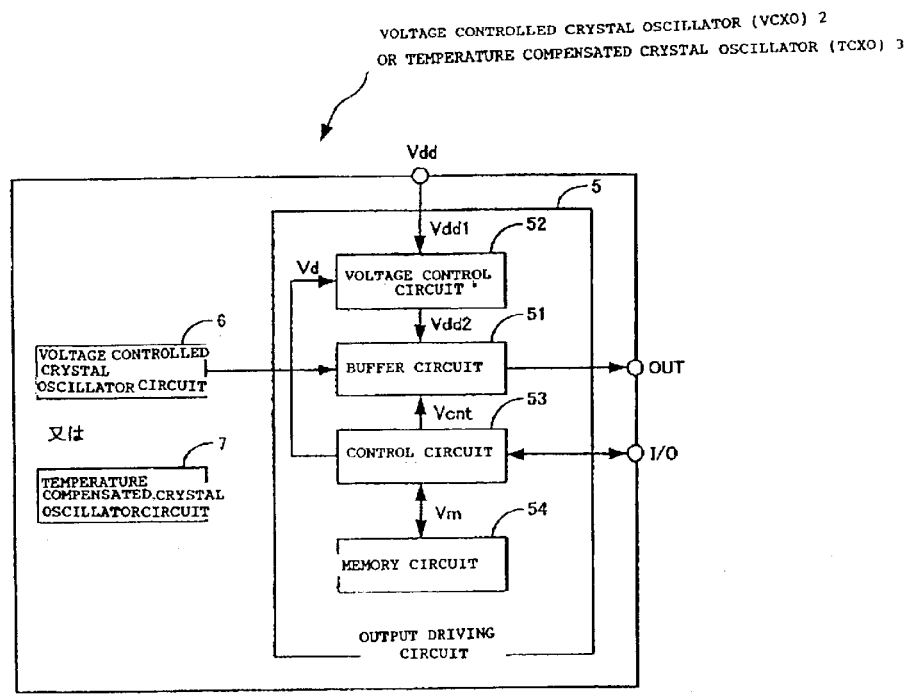

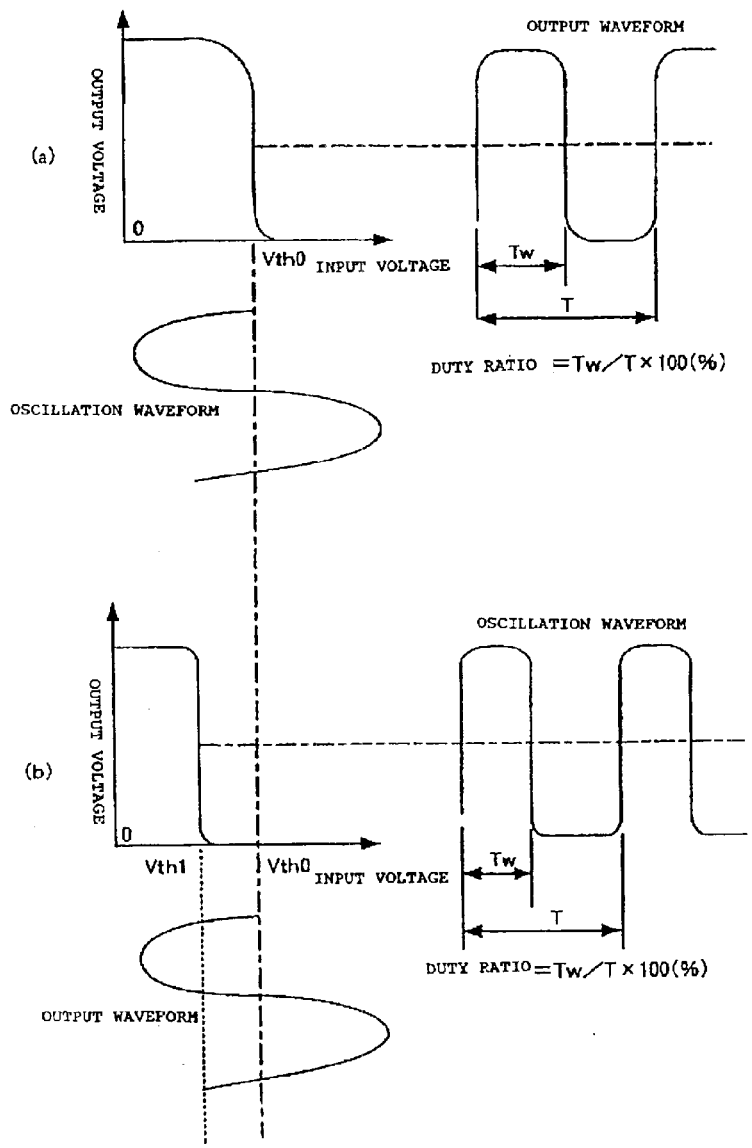
[FIG. 7]

[FIG. 8]
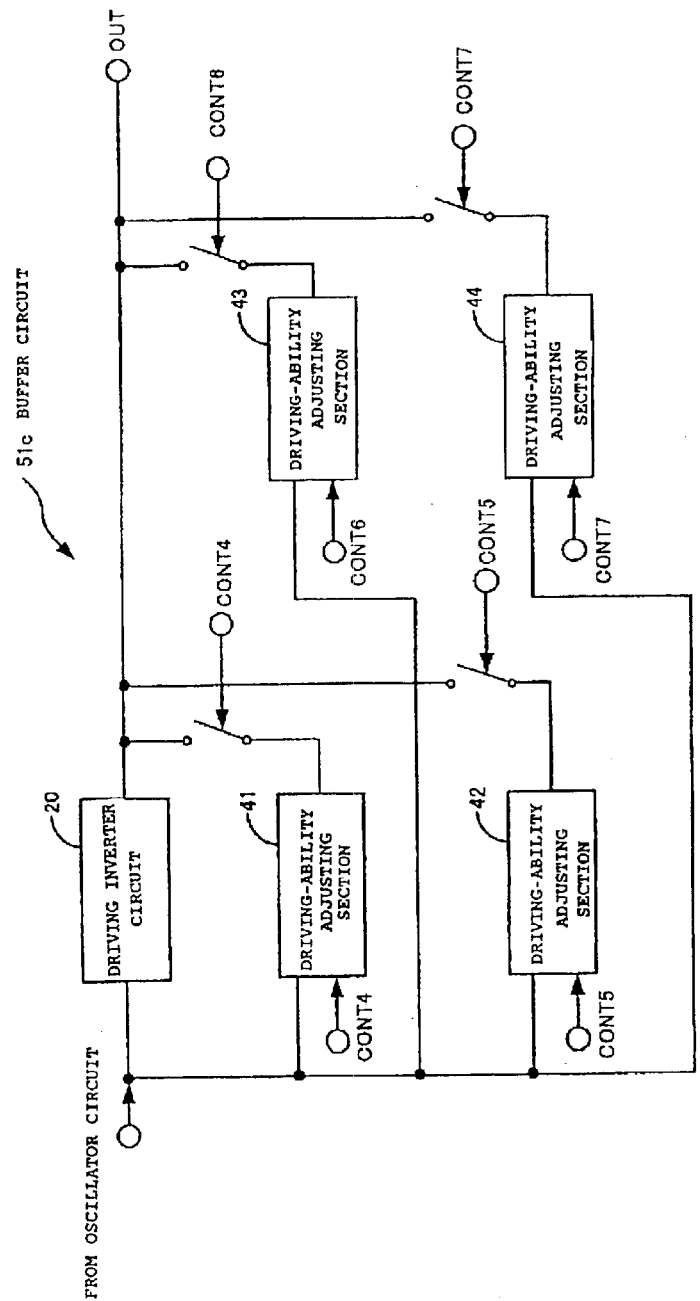

[FIG.9]
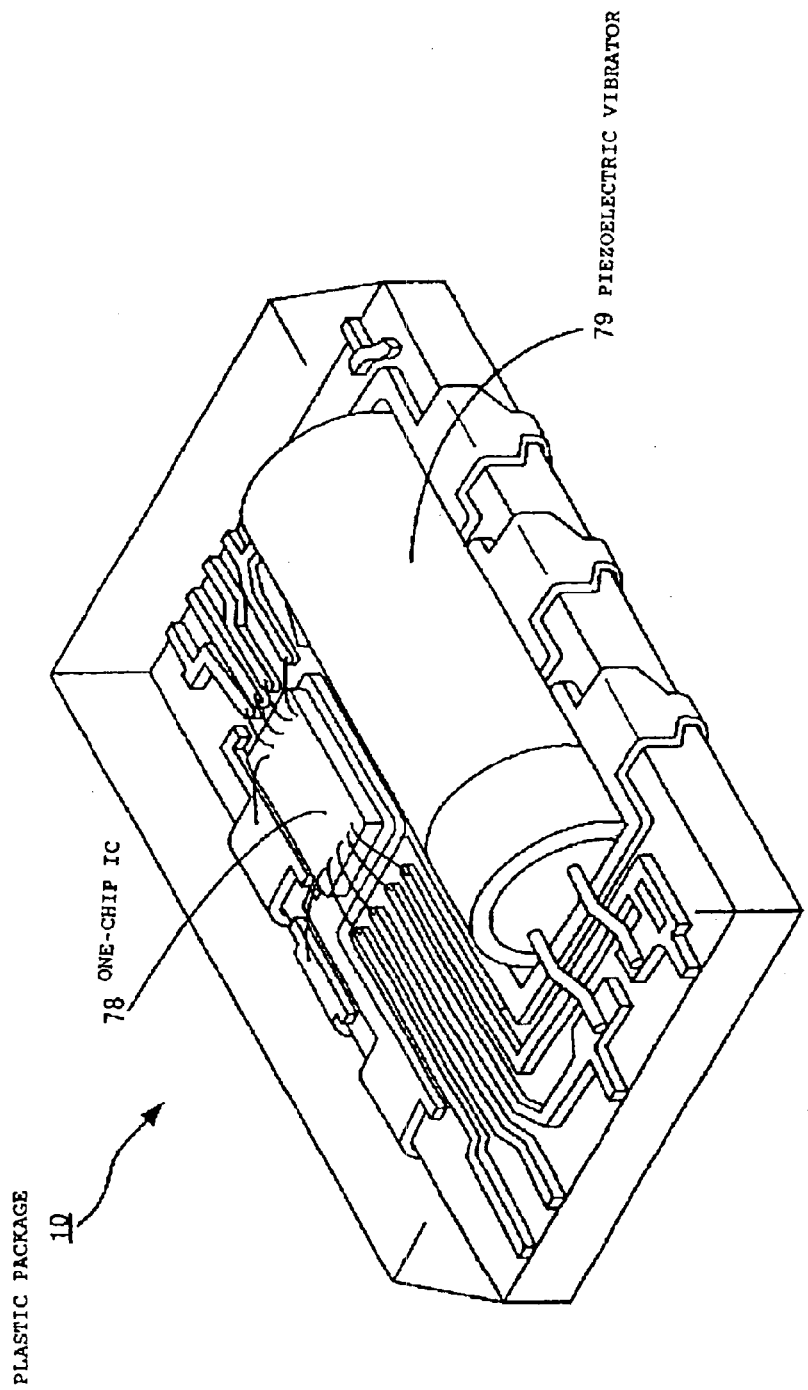

[FIG. 10]
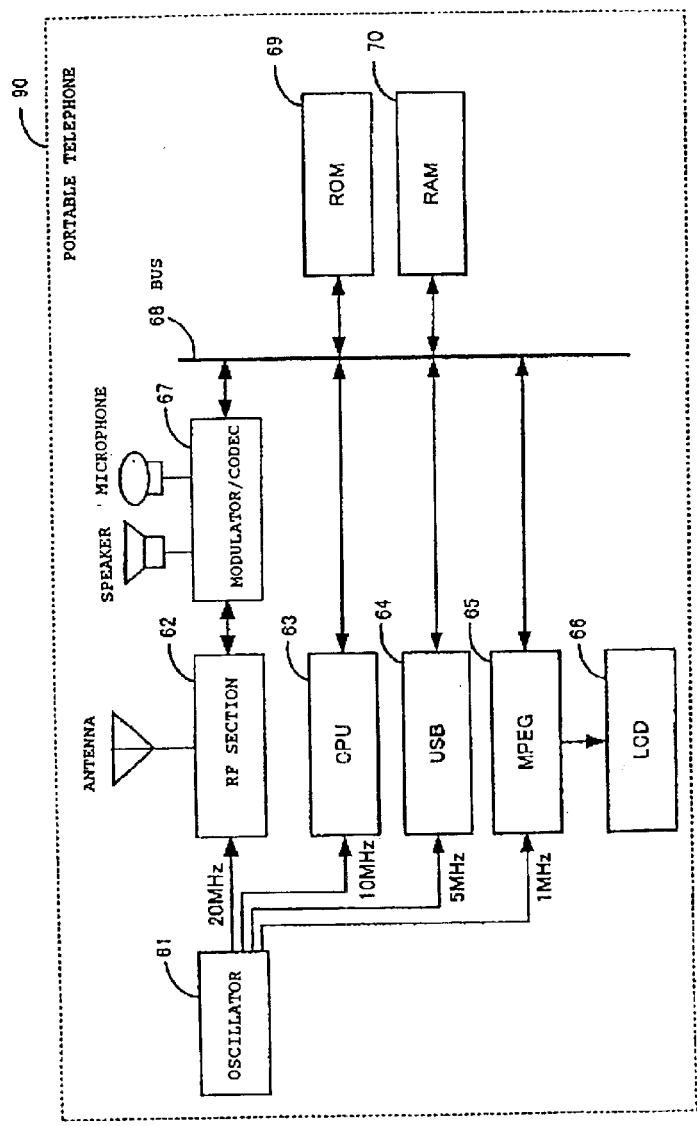

[FIG. 11]
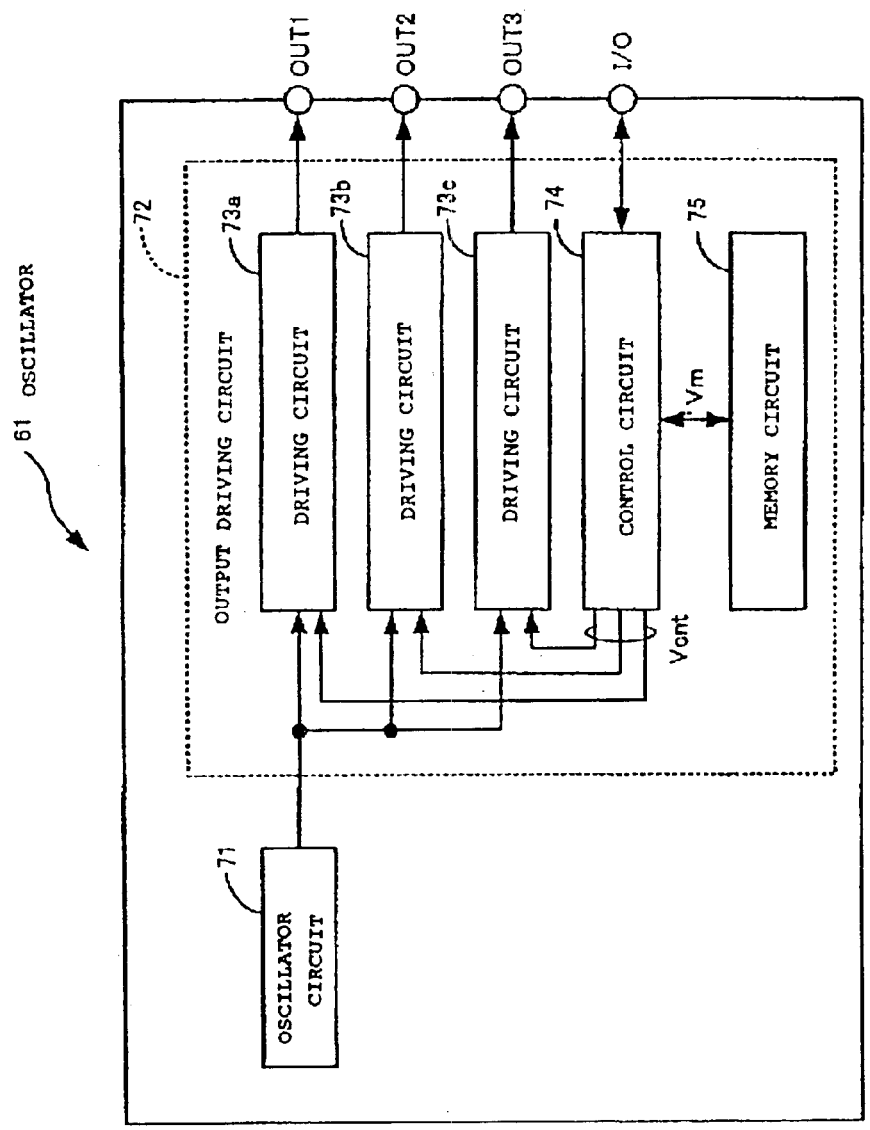

[FIG. 12]
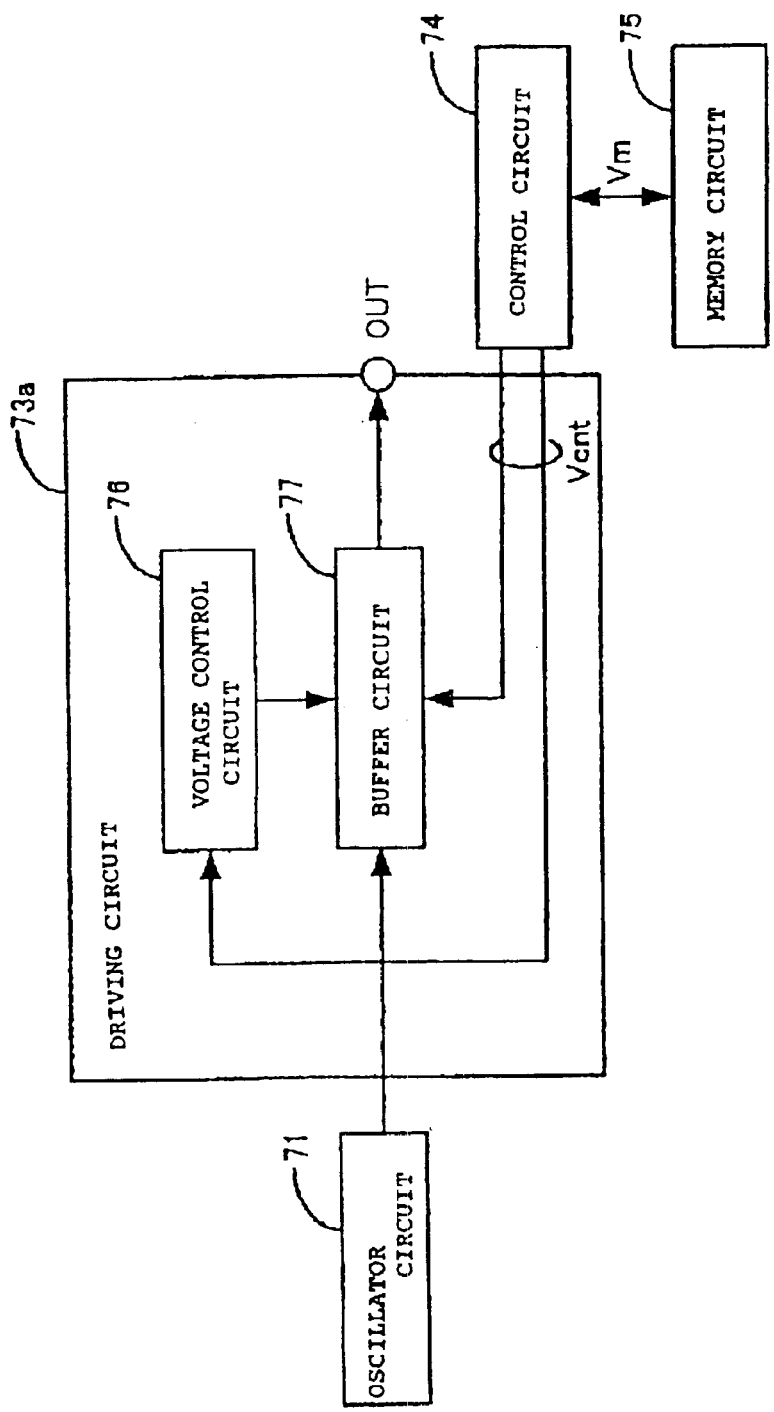

[FIG. 13]
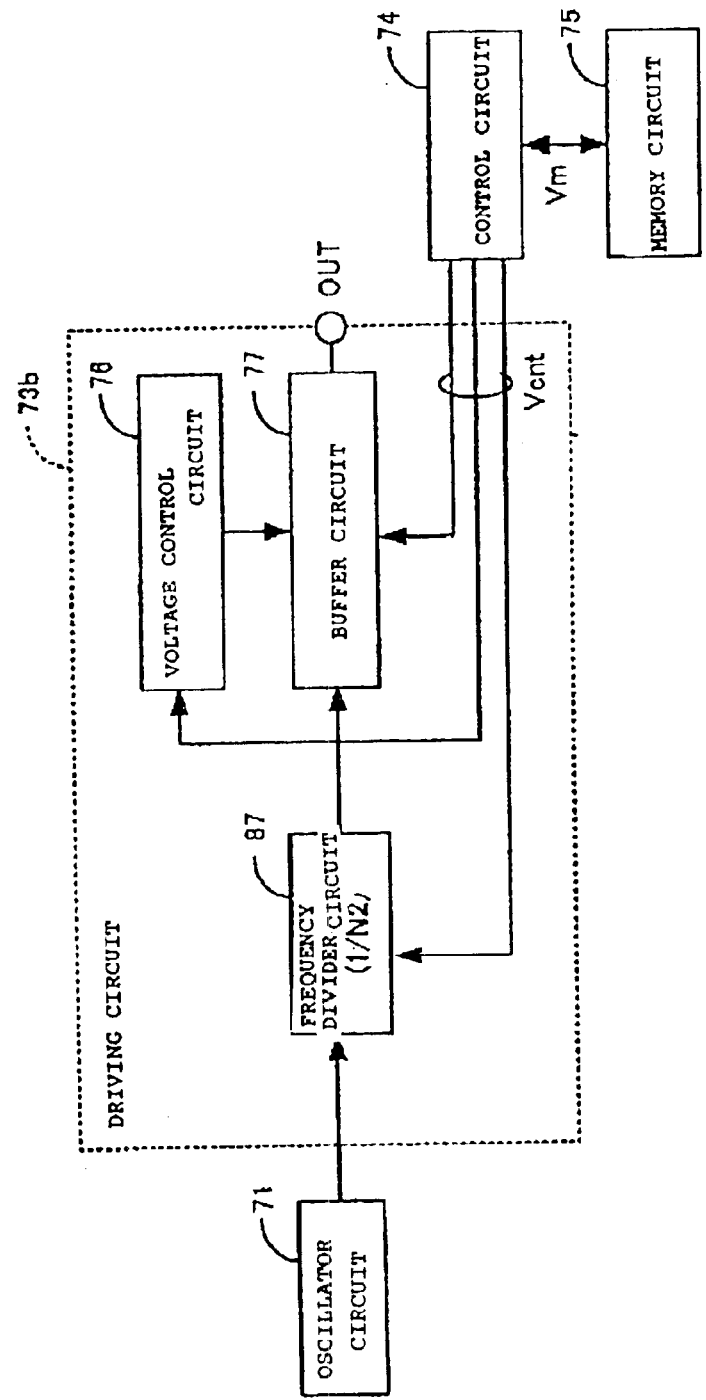

[FIG. 14]
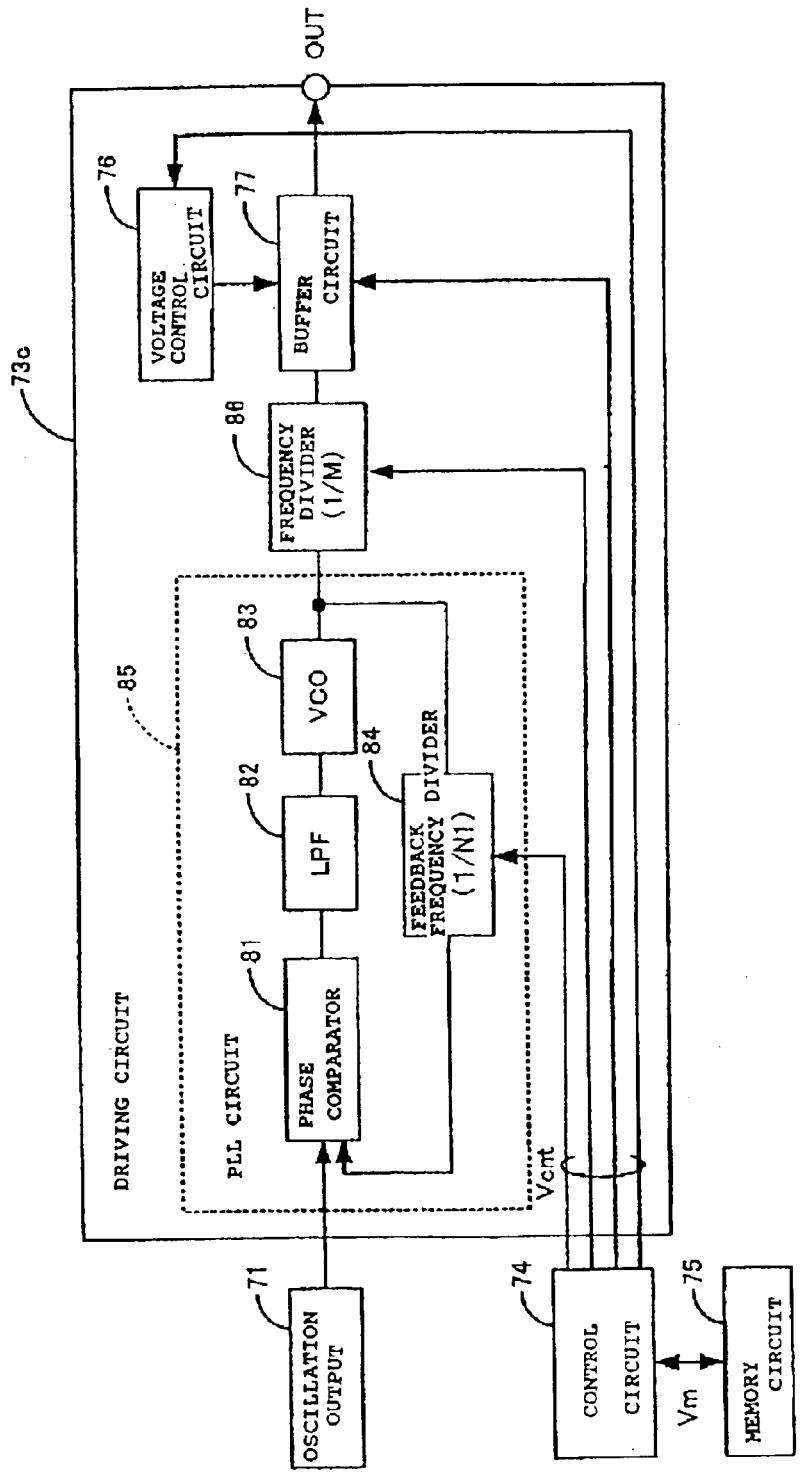

[FIG. 15]
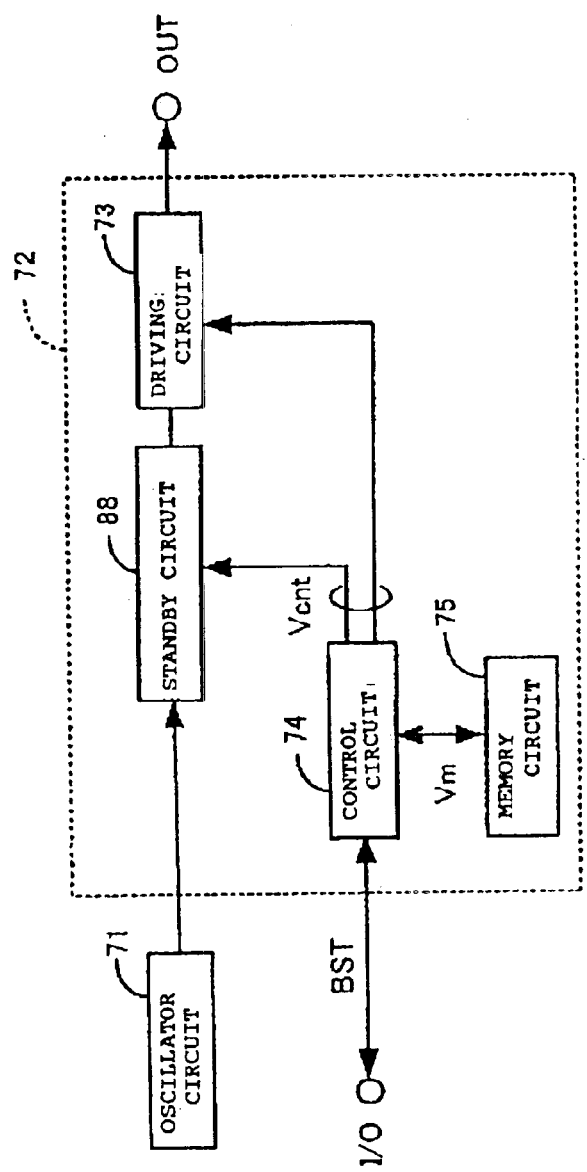

[FIG. 16]
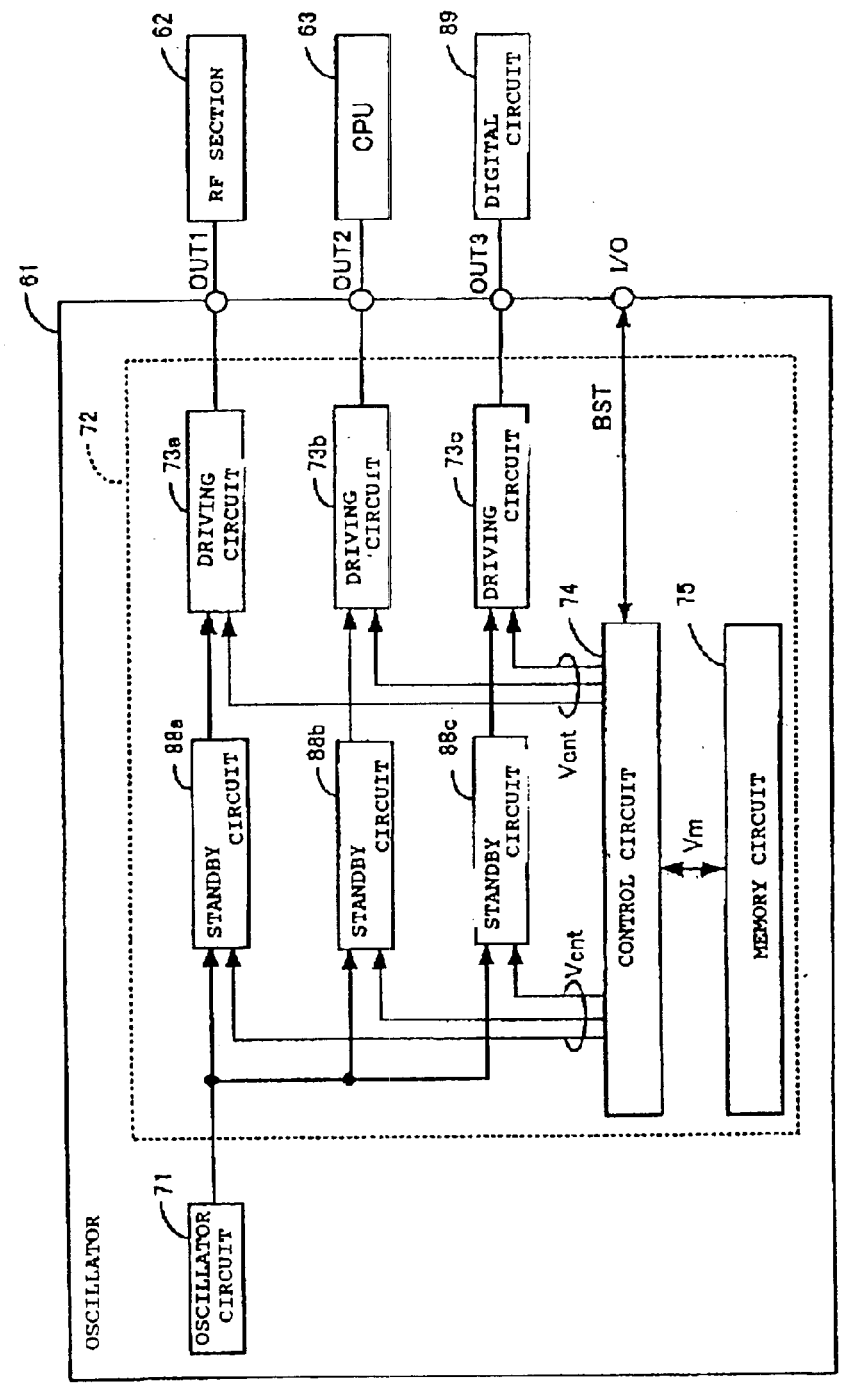

[FIG. 17]
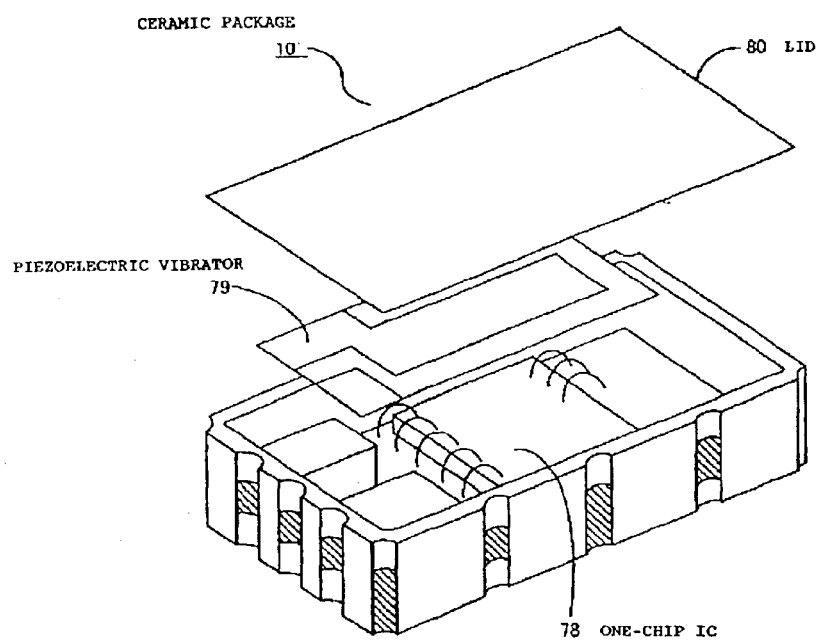

[FIG. 18]  PRIOR ART
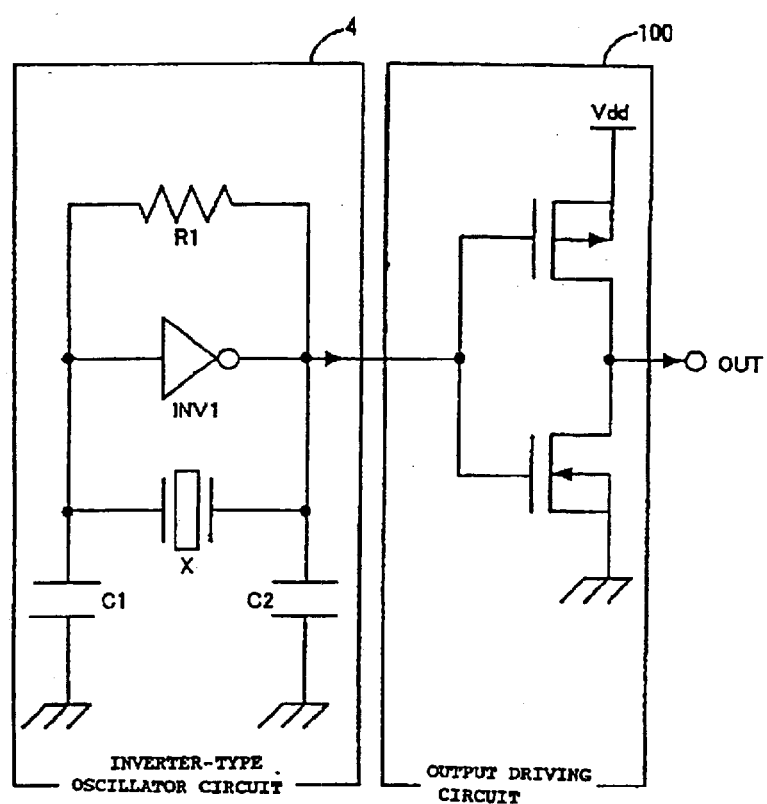

[FIG. 19]
(a) 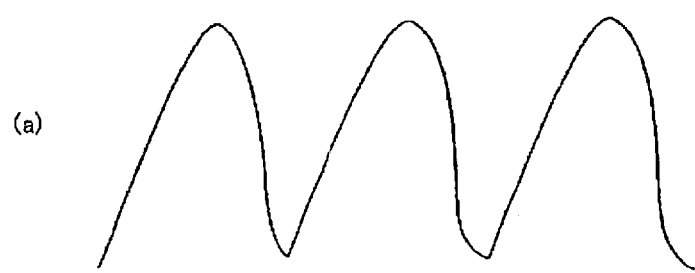
(b) 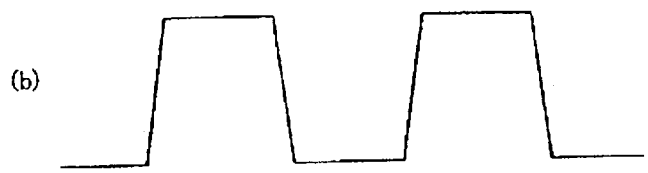

[FIG. 20]
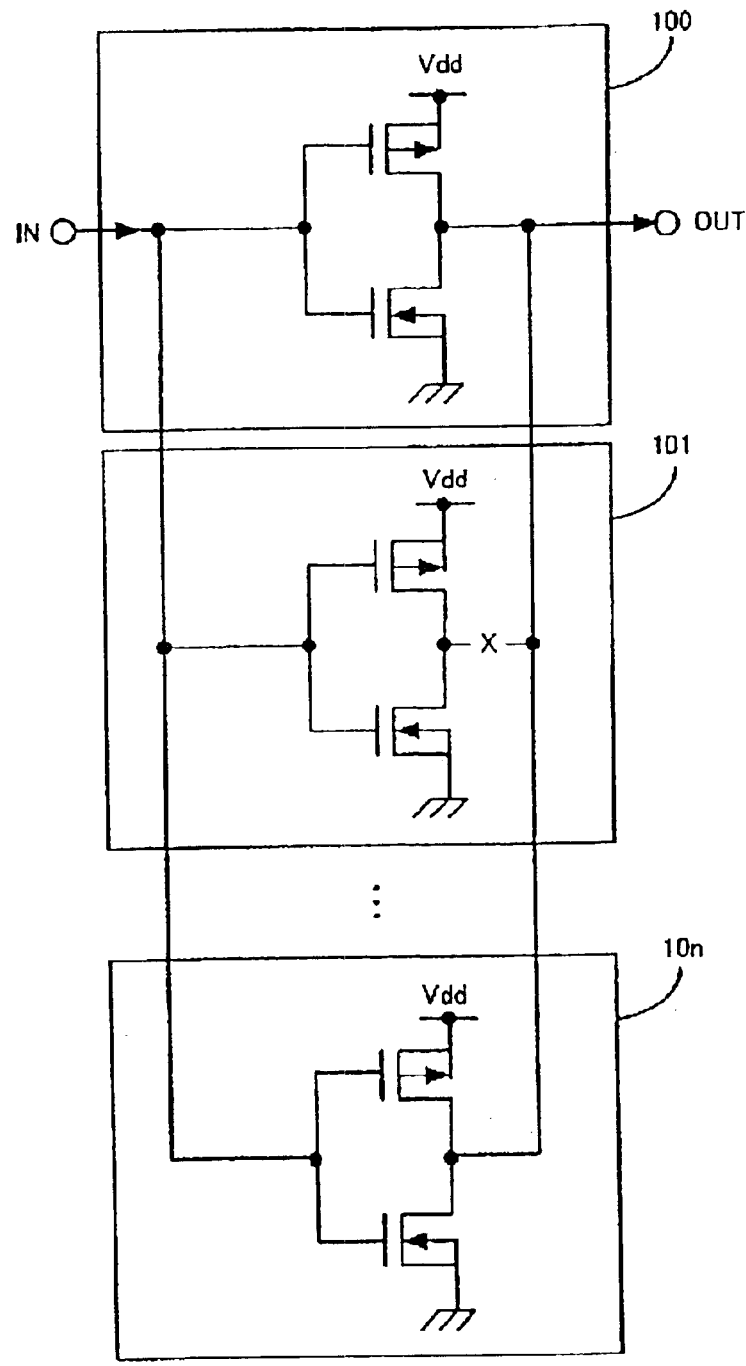

OSCILLATOR AND ELECTRONIC DEVICE USING THE SAME

TECHNICAL FIELD OF THE INVENTION

The present invention relates to oscillators for use in electronic devices, such as cellular phones, and electronic devices using the oscillators. More specifically, the present invention relates to an oscillator capable of voluntarily adjusting the waveform characteristics and the frequency of an output waveform. Further, the present invention relates to an oscillator capable of individually adjusting output waveforms having a plurality of frequencies and to an electronic device having that oscillator.

BACKGROUND OF THE INVENTION

Conventionally, as a reference clock source for an electronic device, such as a microcomputer or cellular phone, a crystal oscillator, such as a temperature compensated crystal oscillator (TCXO), has been used which does not depend on an ambient temperature and/or intrinsic properties of electrical elements and which is superior as a stable oscillation circuit. As load circuits to be connected to the crystal oscillator, many types of load circuits whose load capacities range widely from a small capacity to a large capacity are available. These load circuits are different depending on the application of a user who uses the crystal oscillator.

FIG. 18 is one example of a typical crystal oscillator that has been conventionally used. In this crystal oscillator, the waveform of an oscillation signal generated in an inverter-type oscillation circuit 4, which uses a crystal vibrator X as the oscillation source, is adjusted by an output driving circuit 100, and a signal having a desired output waveform is output from an output terminal OUT. FIG. 19 shows output waveforms of signals output from the output terminal OUT of the output driving circuit in FIG. 18. FIG. 19(a) shows a signal having a pseudo-sine wave, which is called a "clipped sine" for use in cellular phones, and FIG. 19(b) shows a rectangular-wave signal for use in typical digital circuits. FIG. 20 is one example of an output driving circuit having a configuration in which output driving circuits 100, 101, . . . , 10n in the oscillation circuit are connected in parallel at a plurality of stages.

In FIG. 20, the specification of a user-designated output waveform of a signal is determined by one or the combinations of the plurality of the output driving circuits 100, 101, . . . , 10n. Desired characteristics, such as the amplitude of an output waveform, and rising time and falling time characteristics, as specifications for output waveform, are selected by a user, and a signal having a desired output waveform is output from an output terminal OUT. For example, as shown in FIG. 20, disconnecting any of the wiring patterns of the corresponding output driving circuits 100, 101, . . . , 10n, as indicated by the "x" mark in the figure, allows for a change in the waveform characteristics of the output waveform, thereby causing a signal having a desired output waveform to be output from the output terminal OUT.

While the description in the above example has been given for a case in which a crystal oscillator is used, the present invention is not limited thereto. Thus, in conventional, typical oscillators, during manufacture, the wiring pattern of a corresponding output driving circuit is disconnected in accordance with user's specifications to provide a desired output waveform. Thus, to provide a number of output waveforms, the types of output driving circuits are increased, which leads to an increase in manufacturing cost, involving generation of an enormous amount of developing cost or having to control the inventory of many types of output driving circuits. With the conventional crystal oscillator, to meet the requirements of many users, the output driving circuit is designed to be able to deal with a maximum load, and thus the current consumption is inevitably increased. Meanwhile, when the circuit is designed to have reduced current consumption, and connects a load larger than a pre-set load, the circuit provides smaller amplitude of an output signal from the output terminal OUT, and thus it causes a problem in that specifications requested by a user cannot be satisfied.

In general, the duty ratio of the output waveform, which is typically designed and manufactured to be 50%, varies depending on manufacturing variations in transistors included in the output driving circuit and/or a load at a subsequent stage connected to the oscillator. Since the conventional oscillator cannot adjust such variations in duty ratio, it supplies an output signal having an unbalanced duty ratio.

In addition, a conventional cellular phone uses a plurality of oscillators to supply clock signals having frequencies and waveform characteristics which correspond to functional blocks, such as an analog section and a digital section. This results in an enlarged configuration of the entire oscillator and increased power consumption, thus making it impossible to deal with miniaturization and power saving which are in demand these days.

SUMMARY OF THE INVENTION

The present invention has been made to overcome problems as described above, and an object of the present invention is to provide an oscillator that allows easy selection of desired waveform characteristics, i.e., waveform characteristics in accordance with user's specifications, by adjusting the amplitude of an output signal, rising time and falling time characteristics, and the like in accordance with control data that is used for controlling a driving-ability adjusting circuit and that is stored in a storage circuit, and to provide an electronic device using that oscillator.

Another object of the present invention is to provide an oscillator that allows adjustment of the duty ratio to an optimum value by taking into account a manufacturing variation in transistors included in the oscillator and a variation in a load at a subsequent stage connected to the oscillator, and to provide an electronic device using that oscillator.

Further, another object of the present invention is to provide an oscillator that can reduce current consumption by optimizing the driving ability, of an output driving circuit, in accordance with a connected user's load, and to provide an electronic device using that oscillator.

Even further, another object of the present invention is to achieve miniaturization and power saving of an electronic device including an oscillator by providing a plurality of driving circuits in one oscillator so that each driving circuit can supply a clock signal having a different frequency and waveform characteristics to an individual load circuit. Thus, the object is to provide an oscillator having a multi-output function and an electronic device using that oscillator.

To achieve the foregoing objects, an oscillator according to a first aspect of the present invention includes an oscillation circuit for outputting a signal having an oscillation waveform at a predetermined frequency, and output driving device for receiving the signal having the oscillation waveform and outputting a clock signal having an output waveform with desired waveform characteristics. The output driving device includes a storing device for storing control data for adjusting waveform characteristics of the output waveform, a controlling device for extracting the control data stored in the storing device and outputting the control data for adjusting the waveform characteristics of the output waveform. The output driving device further includes a voltage controlling device for generating and outputting, upon input of a first power-supply voltage from the outside, a second power-supply voltage for defining the output amplitude of the output waveform in accordance with the control data; and a buffer circuit for adjusting, upon input of the signal having the oscillation waveform and the second power-supply voltage, the waveform characteristics of the output waveform in accordance with the control data, and outputting a clock signal to the outside.

According to the oscillator of the first aspect of the present invention, to provide a clock signal having waveform characteristics of an output waveform in accordance with a user-defined, predetermined specifications, in a manufacturing process, control data for controlling the buffer circuit is pre-written in a storing device, such that the controlling device controls the output driving device in accordance with the control data, which is stored in the storing device, to adjust the waveform characteristics to characteristics desired by the user. Unlike a conventional oscillator, this arrangement can eliminate a need for redundantly developing various types of integrated circuits (ICs) in accordance with each user's specifications in the developing process and manufacturing them. Since it is sufficient to develop and manufacture only one type of IC, it significantly simplifies the production control. In addition, to output and supply a desired clock signal from the buffer circuit, there is no need to mount a crystal vibrator and an IC in accordance with user's specifications to manufacture a crystal oscillator, and thus it is sufficient to manufacture only one type of crystal oscillator, which can achieve a reduction in inventory control cost.

In an oscillator according to a second aspect of the present invention, the buffer circuit includes output device for outputting, upon input of the signal having the oscillation waveform and the second power-supply voltage, the clock signal having the adjusted output amplitude of the output waveform to the outside; and a plurality of driving-ability adjusting device for adjusting, upon input of the signal having the oscillation waveform and the second power-supply voltage, the waveform characteristics of the output waveform in accordance with the control data, and outputting clock signals to the outside. The buffer circuit further includes a switching device for selecting the clock signals output from the corresponding driving-ability adjusting device, in accordance with the control data. The switching device is operated in accordance with the control data to adjust the waveform characteristics of the output waveform.

According to the oscillator of the second aspect of the present invention, the switching device is selectively operated in accordance with the control data for adjusting the waveform characteristics of the output waveform stored in the storing device. As a result, a clock signal having waveform characteristics of an output waveform in accordance with user's requirements can be output.

The buffer circuit in an oscillator according to a third aspect of the present invention simultaneously operates at least one of the driving-ability adjusting devices and the corresponding switching device, in accordance with the control data.

According to the oscillator of the third aspect of the present invention, at least one driving-ability adjusting device and the corresponding switching device are simultaneously operated, which can reduce power consumption and also can provide a clock signal having waveform characteristics desired by the user. For such reasons, it is preferable to simultaneously operate the driving-ability adjusting device and the corresponding switching device.

The voltage controlling device in an oscillator according to an fourth aspect of the present invention selects a plurality of resistors included in the voltage controlling device to generate the second power-supply voltage, in accordance with the control data supplied from the storing device.

In accordance with the control data, the voltage controlling device in the oscillator of the fourth aspect of the present invention selects one of the plurality of resistors provided in the voltage controlling device, which is designated by the user, and controls an operation condition. This allows the user to obtain desired amplitude of an output waveform from the oscillator.

The output driving device in an oscillator according to a fifth aspect of the present invention is comprised of the voltage controlling device and the buffer circuit, and includes a plurality of driving devices for outputting clock signals each having an output waveform with desired waveform characteristics. In accordance with the control data stored in the storing device, the controlling device causes each driving device to output a clock signal having an output waveform with desired waveform characteristics.

The oscillator of the fifth aspect of the present invention has multi-output terminals, and thus can output clock signals, each having different waveform characteristics, such as a duty ratio of a waveform, a slew rate representing rising/falling times characteristics, and an amplitude, from corresponding output terminals. Thus, one oscillator can send desired clock signals to corresponding functional blocks having different functions, such as an RF section, CPU, digital circuit, and image display section of a cellular phone. Furthermore, only writing desired control data in the storing device allows clock signals, each having optimum waveform characteristics and amplitude, to be sent to the corresponding functional blocks from the multi-output oscillator. Thus, preparing a common oscillator and only re-writing the control data can achieve an oscillator that has been customized which significantly simplifies the oscillator inventory control. In addition, since a single oscillator can send individual clock signals to a number of functional blocks, it is possible to further reduce the assembly space compared to a conventional oscillator. In addition, since the integration into one oscillator reduces current consumption, power saving can be achieved.

In an oscillator according to a sixth aspect of the present invention, at least one of the plurality of driving device includes a frequency divider circuit for dividing the frequency of the clock signal to be output.

According to the oscillator of the sixth aspect of the present invention, among output driving devices having multi-output, a driving device corresponding to a load system whose frequency needs to be adjusted includes a frequency divider circuit. Thus, a single oscillator can adjust the waveform characteristics and amplitude of the clock signal, as well as being able to supply multiple types of oscillation frequencies.

In an oscillator according to a seventh aspect of the present invention, at least one of the plurality of driving devices includes a PLL circuit for multiplying the frequency of the clock signal to be output.

According to the oscillator of the seventh aspect of the present invention, since at least one of the plurality of driving devices includes a PLL circuit, one oscillator can supply multiple types of oscillation frequencies.

In an oscillator according to an eighth aspect of the present invention, a standby circuit for blocking, during a standby mode, an oscillation signal supplied from the oscillation circuit is provided.

Since the oscillator of the eighth aspect of the present invention includes the standby circuit for blocking the oscillation signal, for example, during a standby mode of a cellular phone, the operation of the driving device can be stopped by closing the gate of the standby circuit to thereby place the cellular phone into a standby mode. This can accomplish power saving in a cellular phone, and thus can achieve a cellular phone that can reduce battery consumption.

In an oscillator according to a ninth aspect of the present invention, the plurality of driving devices included in the output driving device includes a first driving device for outputting, in accordance with the control data stored in the storing device, a clock signal having an output waveform with desired waveform characteristics; and a second driving device for outputting, in accordance with the control data stored in the storing device, a clock signal having an output waveform with desired waveform characteristics, the second driving device including a PLL circuit for multiplying the frequency of the clock signal. The plurality of driving devices further include a third driving device for outputting, in accordance with the control data stored in the storing device, a clock signal having an output waveform with desired waveform characteristics, the third driving device including a frequency divider circuit for dividing the frequency of the clock signal. The plurality of driving devices further include standby circuits for, during a standby mode, blocking oscillation signals supplied to the first to third driving device from the oscillation circuit.

According to the ninth aspect of the present invention, the multi-output oscillator can supply clock signals, each having a different frequency and waveform characteristics, to corresponding functional blocks of a cellular phone, such as an RF section, CPU, and digital circuit. Furthermore, only writing desired control data in the memory circuit allows clock signals, each having a frequency and waveform characteristics, which are optimum, to be supplied to the corresponding functional blocks.

A tenth aspect of the present invention is also applied to an electronic device that has an oscillator therein and operates in accordance with a clock signal output from the oscillator.

According to the tenth aspect of the present invention, since control data for adjusting the waveform characteristics of an output waveform can be stored in the storing device of the oscillator, this arrangement allows one type of oscillator to be used for an electronic device on which otherwise a plurality of oscillators having different specifications would be mounted.

BRIEF DESCRIPTION OF THE DRAWINGS

FIG. 1 is a block diagram illustrating the configuration of a crystal oscillator according to a first embodiment of the present invention;

FIG. 2(a) illustrates a buffer circuit constituted by a one-stage driving-ability adjusting section;

FIG. 2(b) is a logic diagram corresponding to the operational states for the driving ability of the buffer circuit;

FIG. 3(a) illustrates a buffer circuit constituted by driving-ability adjusting sections at three stages;

FIG. 3(b) is a logic diagram corresponding to the operational states for each driving ability of the buffer circuit;

FIG. 4(a) is a specific circuit diagram illustrating one example of a voltage control circuit;

FIG. 4(b) is a logic diagram corresponding to each operational mode of the voltage control circuit;

FIG. 5(a) is an output waveform view for use in a cellular phone;

FIG. 5(b) is an output waveform view in which rising characteristic and falling characteristic of a waveform in a digital circuit for use in a typical electronic device are adjusted;

FIG. 5(c) is an output waveform view in which characteristics of output amplitude are adjusted;

FIG. 6 is a block diagram illustrating the configuration of an oscillator, according to a first embodiment of the present invention, that uses a voltage controlled oscillation circuit or a temperature compensated oscillation circuit;

FIG. 7 includes graphs illustrating a method for varying the duty ratio of an output waveform in a second embodiment of the present invention;

FIG. 8 is a block diagram illustrating the configuration of a buffer circuit when the amplitude, duty ratio, rising time, and falling time of an output signal in the crystal oscillator of the present invention are adjusted;

FIG. 9 is a structural view when the oscillator of the present invention is constituted with a plastic package;

FIG. 10 is a block diagram illustrating the configuration of a multifunctional cellular phone using the oscillator of the present invention;

FIG. 11 is a block diagram illustrating the configuration of a multi-output oscillator of the present invention for use in the cellular phone shown in FIG. 10;

FIG. 12 is a block diagram illustrating the configuration of one driving circuit and peripheral circuits in the oscillator of the present invention shown in FIG. 11;

FIG. 13 is a block diagram illustrating a driving circuit, which has a frequency divider circuit at a stage prior to the buffer circuit, and peripheral circuits in the oscillator of the present invention;

FIG. 14 is a block diagram illustrating the configuration of a driving circuit, which has a PLL circuit and a frequency divider, and peripheral circuits in the oscillator of the present invention;

FIG. 15 is a block diagram of a circuit in which a standby function is added to the output driving circuit in the oscillator of the present invention;

FIG. 16 is a block diagram illustrating the configuration of a case in which the standby circuits are provided in the multi-output oscillator of the present invention shown in FIG. 11;

FIG. 17 is a structural view when the oscillator of the present invention is constituted with a ceramic package;

FIG. 18 is a specific circuit diagram of a crystal oscillator of the related art;

FIG. 19 includes waveform views of oscillation outputs, which are output from the crystal oscillator shown in FIG. 18, in accordance with applications; and FIG. 20 is a circuit diagram when driving circuits in the crystal oscillator of the related art are connected at a plurality of corresponding stages to form an output driving circuit.

DETAILED DESCRIPTION OF THE PREFERRED EMBODIMENTS

Embodiments of an oscillator according to the present invention will be described below in detail with reference to the accompanying drawings.

First Embodiment

FIG. 1 is a block diagram illustrating the configuration of a crystal oscillator 1 according to a first embodiment of the present invention. Referring to FIG. 1, the crystal oscillator 1 includes an inverter-type oscillation circuit 4 and an output driving circuit (output driving device) 5. The inverter-type oscillation circuit 4 oscillates and outputs an oscillation waveform at a predetermined frequency. The output driving circuit 5 receives the oscillation waveform from the inverter-type oscillation circuit 4, adjusts the waveform characteristic of the output waveform in the crystal oscillator 1, and outputs a clock signal having a desired output waveform. The inverter-type oscillation circuit 4 includes a resistor R1, a CMOS inverter INV1, a crystal vibrator X, and capacitors C1 and C2.

The output driving circuit 5, which receives the oscillation signal from the inverter-type oscillation circuit 4, includes a memory circuit (storing device) 54, a control circuit (controlling device) 53, a voltage control circuit (voltage controlling device) 52, and a buffer circuit 51. The memory circuit 54 stores control data for adjusting the waveform characteristic of the output waveform in the crystal oscillator 1. The control circuit 53 extracts the control data stored in the memory circuit 54 and outputs the data for adjusting the waveform characteristic of the output waveform. The voltage control circuit 52 receives a power-supply voltage (a first power-supply voltage) Vdd1 supplied from a power-supply voltage supply terminal Vdd, generates a predetermined power-supply voltage (a second power-supply voltage) Vdd2 in accordance with the control data, and outputs the power-supply voltage Vdd2. The buffer circuit 51 receives the above-noted oscillation waveform as well as the predetermined power-supply voltage Vdd2 output from the voltage control circuit 52, adjusts the waveform characteristics of the output waveform in the crystal oscillator 1 in accordance with the above-noted control data, and outputs a desired clock signal to the outside. The predetermined power-supply voltage Vdd2 is a power-supply voltage supplied to the buffer circuit 51 and is determined based on the specifications of a user's clock input circuit to be connected to an output terminal OUT.

In the voltage control circuit 52, control data Vd is used for generating the predetermined power-supply voltage Vdd2 and is also used for selecting a plurality of resistors included in the voltage control circuit 52, which is described later and shown in FIG. 4. Control data Vcnt is constituted by control signals CONT1 to CONT3 and is control data for selecting and operating corresponding driving-ability adjusting sections 21 to 23 and switching elements SW1 to SW3, which are described later and shown in FIG. 3. The control data Vcnt and Vd is determined based on the specifications of a user's circuit to be connected to the output terminal OUT. Thus, during manufacture, the control data, Vcnt and Vd, are recorded in the memory 54 via the control circuit 53 by using a writing device, not shown, that is connected outside an I/O terminal.

FIG. 2(a) is a circuit diagram of a configuration in which a buffer circuit 51a is constituted by MOS transistors, and FIG. 2(b) is a logic diagram showing operational states of the driving-ability adjusting section 21. More specifically, FIG. 2(a) is a circuit diagram of the buffer circuit 51a that includes a driving inverter circuit 20, which is constituted by MOS transistors, a driving-ability adjusting section 21, which is also constituted by MOS transistors, and a switching element SW1. FIG. 2(b) is a logic diagram illustrating operational states of the driving-ability adjusting section 21, which is controlled in accordance with the control data Vcnt (CONT 1) output from the control circuit 53. The logic diagram in FIG. 2(b) shows that, when the switching element SW1 is turned on (i.e., the control data CONT1 is set at the high level (H level)), the driving ability becomes high, and when the switching element SW1 is turned off (i.e., the control data CONT1 is set at the low level (L level)), the driving ability becomes low.

Herein, the term "driving ability" represents an ability to drive a user's load circuit, i.e., the waveform characteristics of the output waveform in the crystal oscillator 1, such as the amplitude, and the rising and falling times of an output signal when the user's load circuit is connected.

FIG. 3(a) is a circuit diagram when the three driving-ability adjusting sections 21 to 23 are provided in parallel, and FIG. 3(b) is a logic diagram showing operational states of the driving-ability adjusting sections 21 to 23, which are controlled in accordance with the control data Vcnt (CONT1 to CONT3) from the control circuit 53. Referring to FIG. 3(a), a buffer circuit 51b includes a driving inverter circuit (outputting device) 20, the plurality of driving-ability adjusting sections (driving ability adjusting device) 21 to 23, and the plurality of switching elements (switching device) SW1 to SW3. The driving inverter circuit 20 receives the oscillation waveform from the inverter-type oscillation circuit 4 via an input terminal IN, adjusts the output amplitude of the output waveform, and outputs a signal to the outside. The driving-ability adjusting sections 21 to 23 receive the oscillation wave signal from the inverter-type oscillation circuit 4, and adjust the waveform characteristics of the output waveform in accordance with the control data Vcnt (CONT1 to CONT3) output from the control circuit 53, which is shown in FIG. 1. The switching elements SW1 to SW3 turn on and off clock signals output from the corresponding driving-ability adjusting sections 21 to 23, in accordance with the control data Vcnt (CONT1 to CONT3) output from the control circuit 53.

The driving inverter circuit 20 is formed with a p-channel MOS transistor (hereinafter referred to as a "p-ch MOS transistor") and an n-channel MOS transistor (hereinafter referred to as an "n-ch MOS transistor). Each of the driving-ability adjusting sections 21, 22, and 23 is formed with two p-ch MOS transistors and two n-ch MOS transistors. As shown in FIG. 3(b), in accordance with the ON/OFF states of the switching elements SW1 to SW3, the driving ability of the crystal oscillator 1 is selected to either one of "low", "medium", and "high."

To increase the ability to drive a load connected to the crystal oscillator 1, the channel width and the channel length, which are not shown, of the CMOS transistors, which constitute the driving-ability adjusting sections 21 to 23, may be increased to allow a greater amount of electricity to flow in the CMOS transistors. As a result, in the first embodiment, selecting more of the driving-ability adjusting sections 21 to 23 can provide the crystal oscillator 1 with higher driving ability. And the higher driving ability can provide an output waveform with short rising and falling times.

FIG. 4(a) is a circuit diagram specifically illustrating an example of the voltage control circuit 52. The voltage control circuit 52 includes a MOS transistor Q31, an operational amplifier OP32, a reference voltage Vref, four resistors R33 to R36, and three switching elements SW37 to SW39. Further, FIG. 4(b) is a logic diagram showing a specific example of the power-supply voltage Vdd2, which is determined by the operational states of the switching elements SW37 to SW39 and is supplied to the buffer circuit 51.

The operation of the voltage control circuit 52 will be specifically described with reference to FIG. 4. The power-supply voltage Vdd2 is given by the following expression (1):

$$Vdd2 \cong \{1+R33/(R34+R35+R36)\}Vref \qquad (1)$$

where Vdd1 is an external power-supply voltage and Vref is a reference voltage for the operational amplifier OP32.

By way of example, when Vdd1=2 V, Vref=1 V, R indicates each resistance of the resistors R33 to R36, the power-supply voltage Vdd2 is determined by using expression (1) for each operational state of the switching elements SW37 to SW39. As a result, the power-supply voltage Vdd2 in each operational mode of the switching elements SW37 to SW39 becomes values as shown in the logic diagram of FIG. 4(b). Thus, the user may store the control data Vd for controlling the use states of the resistors R33 to R36 in the memory circuit 54, based on his or her specifications. This can provide the power-supply voltage Vdd2 based on the specifications desired by the user and can easily provide the output amplitude of the output waveform in the crystal oscillator 1.

FIG. 5 includes graphs showing various output waveforms output due to the difference in driving abilities of the output driving circuit 5 according to the present invention. FIG. 5(a) is a graph showing a waveform, which are called a "clipped sine" and is used for a cellular phone or the like; FIG. 5(b) is a waveform view showing an adjustment of rising/falling times characteristics of a waveform in a digital circuit that is generally used; and FIG. 5(c) is a waveform view illustrating an adjustment of the output amplitude characteristic of a waveform in the digital circuit.

The operation of the crystal oscillator 1 according to the first embodiment will now be described with reference to FIGS. 1 to 5. Referring to FIG. 3(b), a description will be given for a case in which each characteristic of the output amplitude, rising time, and falling time of an output waveform in the buffer circuit 51b is set to "medium".

Referring to FIG. 1, the control circuit 53 stores, in the memory circuit 54, control data Vm, which is sent from an external controller, not shown, via the I/O terminal. The control circuit 53 then extracts the control data Vm, which is used for selecting one or more of the driving-ability adjusting sections 21 to 23 at the respective stages shown in FIG. 3, from the memory circuit 54. Further, the control circuit 53 also outputs control data Vcnt (e.g., CONT1: H level, CONT 2: H level, and CONT 3: L level) to the corresponding driving-ability adjusting sections 21 to 23, and simultaneously outputs the control data Vcnt to the corresponding switching elements SW1 to SW3, which are connected to the output terminal OUT.

Meanwhile, the control circuit 53 extracts the control data Vm from the memory circuit 54, and, based on the control data Vd supplied in accordance with the control data Vm, controls the switching elements SW37 to SW39, which are connected in parallel with the series resistors R33 to R36 in the voltage control circuit 52. The voltage control circuit 52 outputs the predetermined power-supply voltage Vdd2, which defines the output amplitude of the output waveform.

In the example in which the control data Vcnt described above is, for example, such that CONT1 is at the H level, CONT2 is at the H level, and CONT 3 is at the L level, the driving-ability adjusting sections other than the third-stage driving-ability adjusting section 23 of the three-stage driving-ability adjusting sections 21 to 23 are in operation. Thus, output waveforms Sout1 and Sout2 based on the respective driving abilities are output via the corresponding switching elements SW1 and SW2, and then are output as an output waveform Sout of the driving inverter circuit 20. As a result, a clock signal having the output waveform Sout whose output amplitude, rising time, and falling time have been adjusted, as shown in FIG. 5, in accordance with users specifications can be output from the output terminal OUT of the crystal oscillator 1 to the outside.

The operation of the crystal oscillator described above will now be summarized with reference to FIG. 1. Control data for a clock signal to be output from the output terminal OUT of the output driving circuit 5 is written in the memory circuit 54 in advance. An oscillation signal which is output from the inverter-type oscillation circuit 4, which uses the crystal vibrator X as the oscillation source, is input to the buffer circuit 51 in the output driving circuit 5. At this point, the control circuit 53 supplies the control data to the voltage control circuit 52. In response to the control data, the voltage control circuit 52 adjusts the waveform of the oscillation signal input to the buffer circuit 51. The buffer circuit 51 supplies a clock signal, which has an amplitude, a duty ratio, and rising/falling times characteristics of the output waveform in accordance with the control data, to a user's load circuit, not shown, via the output terminal OUT.

The oscillator of the first embodiment, which performs such an operation, can provide some advantages as described below.

In the oscillator of the first embodiment, to provide the output amplitude of the output waveform and the waveform characteristics of a rising time and falling time in accordance with a user-designated, predetermined specifications, in a manufacturing process, the control data Vm for selecting the voltage control circuit 52 and the driving-ability adjusting sections 21 to 23 to be used is pre-stored. Then, in accordance with the control data Vm stored in the memory circuit 54, under the control of the control circuit 53, waveform characteristics of the output waveform is adjusted to have characteristics in accordance with individual requests by the user. As a result, unlike the conventional oscillator, there is no need to redundantly develop and manufacture various types of ICs in accordance with user's specifications, which allows for adjustment to desired waveform characteristics of an output waveform with only one type of IC. Consequently, it is sufficient to manufacture only one type of IC, thus significantly simplifying the production control of a product. In addition, to provide an output signal, of the buffer circuit 51, having the output amplitude of the output waveform and the waveform characteristics of the rising time and falling time which are desired by a user, there is no need to manufacture a crystal oscillator 1 into which a crystal vibrator X and an IC are incorporated in each time. Thus, it is sufficient to manufacture one type of crystal oscillator 1.

In the oscillator of the first embodiment, while the driving-ability adjusting sections 21 to 23 constituted by three stages, as shown in FIG. 3, has been described, the present invention is not limited thereto and thus the driving-ability adjusting sections may be configured with any number of stages n. This allows the configuration of a crystal oscillator 1 having waveform characteristics of the output amplitude and the rising and falling times of the output waveform in accordance with various specifications.

In addition, it is preferable that the selected at least one of the driving-ability adjusting sections $2n$ and at least one switching element SWn corresponding thereto are operated at the same time, in terms of a reduction in power consumption. That is, a driving-ability adjusting section $2n$ that is not selected and a switching element SWn corresponding thereto are not operated, to thereby achieve a reduction in power consumption.

In the oscillator of the first embodiment, while the buffer circuit 51 has been illustrated using MOS transistors, it may be configured with bipolar transistors having a different circuit form.

Additionally, in the oscillator of the first embodiment, a description has been made of the output amplitude of the output waveform and the waveform characteristics of the rising time and falling time in each of the n-stage driving-ability adjusting sections 21 to 2n. Thus, the description has been made of a case in which the characteristics, of the MOS transistors, which are determined by the channel width and/or channel length of the n-ch MOS transistors or the p-ch MOS transistors that constitute the driving-ability adjusting sections 21 to 2n are equivalent. However, the waveform characteristics, such as the rising characteristic and falling characteristic of the output waveform, may be arranged differently by varying the characteristics of the MOS transistors from each other. This allows for the configuration of the driving-ability adjusting sections with a reduced number of stages to optimize the waveform characteristics and also allows for a reduction in power consumption.

In addition, according to the oscillator of the first embodiment, the control circuit 53 can adjust the driving-ability adjusting sections 21 to 2n in accordance with the control data Vm, which is stored in the control circuit 53, for adjusting each waveform characteristic of the output amplitude, rising time, and falling time of the output waveform. This can provide waveform characteristics of the output waveform in accordance with a user's request, since the output signal selected from a plurality of output signals by a corresponding one of the switching elements SW1 to SWn is supplied as an output signal from the crystal oscillator 1. In addition, since data for adjusting the driving ability can be externally pre-stored in the memory circuit 54 by using a writing device, the control circuit 53 can set, during manufacture of the crystal oscillator 1, the output amplitude of the output waveform of the crystal oscillator 1 and the waveform characteristics in each output waveform at rising time and falling time, in accordance with user's specifications.

Additionally, according to the oscillator of the first embodiment, the control data Vd for controlling the switching elements SW37 to SW39, which are connected in parallel with the resistors R33 to R35, is stored in the memory circuit 54. Further, in accordance with the control data Vd, the control circuit 53 sets the operational state of each of the resistors R33 to R35 provided in the voltage control circuit 52. This allows easy setting of the output amplitude of the output waveform to a desired value, even if user's specifications requirements are different. Thus, even when the output amplitudes of the output waveform output from the buffer circuit 51 are different depending on each user, adjusting the power-supply voltage Vdd2 to be supplied to the MOS transistors allows easy setting of the amplitude of the output waveform to a value desired by the user.

The above description has been given for an oscillator using a CMOS inverter-type crystal oscillation circuit as an example of the oscillation circuit in the first embodiment. The present invention, however, is not limited to the above configuration, and the use of a voltage controlled crystal oscillation circuit 6 or a temperature compensated crystal oscillation circuit 7, as another embodiment, as shown in FIG. 6, can also provide the same advantages as those described above.

Second Embodiment

An oscillator according to a second embodiment of the present invention will now be described. In the second embodiment, in accordance with user's specifications, the duty ratio of an output waveform from the oscillator 1 can be voluntarily changed using the control data written in the memory circuit 54 shown in FIG. 1. Since the configuration of the oscillator according to the second embodiment is the same as that shown in FIGS. 1 to 4 illustrated in conjunction with the first embodiment, and the operation of the second embodiment is also the same as that of the first embodiment except that the duty ratio is different, the detailed descriptions thereof will be omitted.

FIG. 7 includes graphs illustrating the relationship between the input/output voltage characteristic and the input/output waveform of the MOS transistors constituting the driving-ability adjusting section 21. A method for varying the duty ratio will be described with reference to FIG. 7. As shown in the input/output voltage characteristic in FIG. 7, varying $\beta=\beta n/\beta p$ (hereinafter referred to as a "beta ratio"), which is a ratio of parameters $\beta n$ to $\beta p$ which depend on the channel width and channel length of a corresponding n-ch MOS transistor and a p-ch MOS transistor, results in a change in the input/output voltage characteristic (source: very large scale integrated circuit, P16, Baifukan Co., Ltd.).

FIG. 7(a) is a graph showing a case in which the threshold level Vth0 is set such that the duty ratio of the output waveform becomes 50%. In this case, when the beta ratio $\beta$ is increased, the input/output voltage characteristic shown in FIG. 7(a) displays a threshold level Vth1, as shown in FIG. 7(b), which is lower than the threshold level Vth0. As a result, the response level with respect to the oscillation waveform decreases, thereby providing an output waveform having a duty ratio of 50% or less as shown in FIG. 7(b). In contrast, when the beta ratio $\beta$ is reduced, though not shown, the threshold level Vth decreases, thereby providing an output waveform having a duty ratio of 50% or more.

From the foregoing description, as shown in FIG. 3(a), preparing a plurality of driving-ability adjusting sections 2n (n=1 to 3) each having a different beta ratio $\beta$, and selecting at least one of the driving-ability adjusting sections 2n (n=1 to 3), which are controlled by the corresponding controlled data CONT1 to CONTn (n=3) pre-stored in the memory circuit 54, allows an output waveform having a desired duty ratio to be output. For example, the duty ratio of the driving inverter circuit 20 is set to a reference value (e.g., 50%) and at least one of the driving-ability adjusting sections is selected to provide a desired duty ratio that takes into account a variation when a load circuit is connected. The number of the driving-ability adjusting sections 21 to 2n and the number of pieces of the control data CONT1 to CONTn can be arranged to any number as in the first embodiment.

As described above, according to the oscillator of the second embodiment, to provide a duty ratio of an output waveform in accordance with predetermined specifications, in a manufacturing process, control data for selecting the voltage control circuit 52 and the driving-ability adjusting sections 21 to 23 to be used is pre-stored in the memory circuit 54. In accordance with the stored control data, the control circuit 53 adjusts the output waveform to have a desired duty ratio by considering a variation due to manufacturing variations in transistors that constitute the oscillation circuit and the output driving circuit and due to connection of a user's load circuit to the crystal oscillator 1. After such adjustment is made, when a user connects a load circuit to the oscillator to use it, a desired duty ratio (50%) as designed can be provided. The other advantages thereof are analogous to those of the first embodiment.

It is also possible to adjust the output amplitude, duty ratio, rising time, and falling time of an output waveform in the crystal oscillator 1 by combining the first embodiment and the second embodiment. FIG. 8 is a block diagram illustrating the configuration of a buffer circuit 51c when the output amplitude, duty ratio, rising time, and falling time of an output waveform in the crystal oscillator 1 are adjusted. The buffer circuit 51c has, for example, a plurality of driving-ability adjusting sections 41 to 44. This buffer circuit 51c is an example in which the selection or combination of the driving-ability adjusting sections can adjust different duty ratios and different rising and falling times.

Third Embodiment

FIG. 9 is a perspective view illustrating an exemplary configuration of an oscillator according to a third embodiment of the present invention. While no description has been made of a assembly state of components that constitute each oscillator in the first and second embodiments, components, except a piezoelectric vibrator 79, in the third embodiment are integrated into a one-chip IC 78, and the one-chip IC 78 and the piezoelectric vibrator 79 are molded and sealed to provide a plastic package 10.

Fourth Embodiment

An oscillator according to a fourth embodiment of the present invention will now be described. In the fourth embodiment, a description will be made of a multi-output-type oscillator for generating a plurality of clock signals each having a waveform with a different duty ratio, rising and falling characteristics, and amplitude.

In a cellular phone, a plurality of piezoelectric oscillators (e.g., crystal oscillators) is used for supplying reference clock signals to an RF circuit and digital circuits, such as a CPU. Further, as in recent multifunctional cellular phones to which a function of play backing moving pictures is added, it has been increasingly necessary to supply functional blocks with respective clock signals each having a different frequency, waveform characteristic, and amplitude.

FIG. 10 is a block diagram illustrating the configuration of a multifunctional cellular phone. In this cellular phone, a multi-output oscillator 61 supplies clock signals, each having a different frequency, waveform characteristics, and amplitude, individually to an RF section (wireless section) 62, a CPU (central processing unit) 63, a USB (universal serial bus) 64, and an MPEG (motion picture experts group: an image compressing/processing section) 65, and an LCD (liquid crystal display) 66. The RF section 62 is a block having processing functions, such as converting the frequency of an RF signal received from a station, which is provided externally and is not shown. Signals, including sound information, character information, and motion picture information, that are input and output to and from the RF section 62 are supplied to a bus 68 via a modulator/CODEC 67. The CPU 63, the USB 64, and the MPEG 65 are directly connected to the bus 68. Further, a ROM 69 and a RAM 70 are connected to the bus 68. Since a circuit for processing data, including voice communication, character information, and motion picture information, is of a generally known technology and is not directly relevant to the present invention, the description thereof will be omitted.

In the cellular phone 90, the oscillator 61 supplies a sine-wave clock signal that has less higher harmonic components, and that has a frequency of, for example, 20 MHz. The oscillator 61 also supplies rectangular-wave clock signals that have steep rising/falling times and have frequencies of, for example, 10 MHz, 5 MHz, and 1 MHz to the CPU 63, the USB 64, and the MPEG 65, respectively, to drive the corresponding logic circuits thereof. Thus, in the cellular phone 90, conventionally, individual oscillators are provided for supplying clock signals to the blocks of the RF section 62, the CPU 63, the USB 64, and the MPEG 65. Also, a multi-output oscillator capable of supplying a plurality of output signals each having a different signal is known. Such an oscillator, however, supplies clock signals having the same waveform characteristics from output sections; thus, it cannot be used as an oscillator for a multifunctional cellular phone, which has a number of functions as shown in FIG. 10.

That is, in a conventional cellular phone, piezoelectric oscillators having oscillation circuits for individual blocks are prepared. Thus, the power consumption of the cellular phone increases and the size thereof is increased, which are not suitable for the needs for power saving and miniaturization required for the cellular phone. In particular, since a cellular phone uses a battery as a power supply, power saving is an inevitable issue. A conventional cellular phone having a large number of oscillators, therefore, increases the power consumption, thus speeding up the consumption of the battery.

Further, recent cellular phones have been equipped with various functions, such as a function of playing back moving pictures, a function of a USB that serves as an interface with a computer or the like, a data transfer function employing Bluetooth or the like, and a GPS function, as well as a voice communication function. Thus, power saving and miniaturization are increasingly becoming important. Accordingly, in the present invention, to supply clock signals for corresponding various functional blocks included in a cellular phone, an output driving circuit, as shown in FIG. 1, that has a function of adjusting the driving ability and the waveform characteristic is provided in an oscillator, such as a TCXO or VCXO, for generating a clock signal that serves as a reference signal in the RF section, so as to achieve a multi-output oscillator. In addition, incorporating a PLL (phase locked loop) circuit and/or a frequency divider into the oscillator can supply an RF section with a reference clock signal of a cellular phone, and also can supply functional blocks, which realize a motion-picture section, a GPS section, or a data transfer section using an interface function, such as a Bluetooth or USB, with reference clock signals having frequencies required therefor. This can achieve a cellular phone in which power saving and miniaturization that meet the market needs are realized. In the description below, an oscillator that supplies multi-output clock signals each having a different frequency and waveform characteristics will be referred to as a "multi-output oscillator".

A multi-output oscillator of the present invention can adjust the load driving ability (i.e., the amplitude) and the waveform characteristics (i.e., the duty ratio of a waveform and a slew rate, which represents the rising/falling characteristics) of each output signal in accordance with control data written in a memory circuit within the oscillator, thereby allowing optimization of the load driving ability and the waveform characteristics with respect to corresponding load circuits. For example, as illustrated in FIGS. 1 to 5, in accordance with the control data Vcnt written in the memory circuit 54, the driving inverter circuit 20 and the driving-ability adjusting sections 21, 22, and 23 adjust the load driving ability (the amplitudes) and the waveforms of a clock signal to adjust the waveform characteristics (the duty ratio and the slew rate). With this adjustment, a sine-wave clock signal, as shown in FIG. 5(a), can be supplied to the RF section 62 from a corresponding output terminal of the oscillator 61 shown in FIG. 10, and rectangular-wave clock signals, as shown in FIGS. 5(b) and 5(c), can be supplied to the CPU 63, the USB 64, the MPEG 65, which are logic circuits and the like from corresponding output terminals of the oscillator 61.

FIG. 11 is a block diagram illustrating a detailed configuration of the multi-output oscillator of the present invention for use in the cellular phone shown in FIG. 10. In the description below, the multi-output oscillator of the present invention will simply be referred to as an oscillator. The oscillator 61 includes one oscillation circuit 71, which uses a crystal vibrator or the like as a reference oscillation source, and an output driving circuit 72, which includes a plurality of driving circuits 73a, 73b, and 73c, a control circuit 74, and a memory circuit 75. Thus, the oscillator 61 shown in FIG. 11 is an oscillator in which the output driving circuit 5 in the oscillator (crystal oscillator 1) illustrated in FIG. 1 is converted into a multi-output type.

Thus, for comparison of the oscillator 61 shown in FIG. 11 with the oscillator (crystal oscillator 1) shown in FIG. 1, each of the driving circuits 73a, 73b, and 73c shown in FIG. 11 may be read as being constituted by the buffer circuit 51 and the voltage control circuit 52 shown in FIG. 1. In the oscillator (the crystal oscillator 1) shown in FIG. 1, however, the output driving circuit 5 includes one control circuit 53 and one memory circuit 54. In contrast, in the multi-output oscillator of the present invention, as shown in FIG. 11, the common control circuit 74 and the memory circuit 75 are provided for controlling the driving circuits 73a, 73b, and 73c included in the multi-output output driving circuit 72.

The operation of the oscillator 61, shown in FIG. 11 will now be described. Control data for setting the frequency, load driving ability (amplitude), and waveform characteristics (a duty ratio and slew rate) of clock signals to be output from output terminals OUT1, OUT2, and OUT 3 is prewritten in the memory circuit 75. When a clock signal is input to the driving circuits 73a, 73b, and 73c from the oscillation circuit 71, the control circuit 74 controls the driving abilities of the driving circuit 73a, 73b, and 73c individually in accordance with control data written in the memory circuit 75. Since the method for controlling the driving abilities has been illustrated in FIGS. 2 and 3, redundant descriptions will be omitted.

As described above, the driving ability is controlled for each of the driving circuits 73a, 73b, and 73c. As a result, for example, a sine-wave clock signal, as indicated by a broken line in FIG. 5(a), is supplied to the RF section 62 in FIG. 10 from the output terminal OUT1 of the driving circuit 73a. Similarly, a steep, rectangular-wave clock signal, as indicated by a solid line in FIG. 5(b), is supplied to the CPU 63 in FIG. 10 from the output terminal OUT2 of the driving circuit 73c. Also, a rectangular-wave clock signal having small amplitude, as indicated by a broken line in FIG. 5(c), is supplied to the USB 64 in FIG. 10 from the output terminal OUT3 of the driving circuit 73b. While the case in which three driving circuits are provided has been illustrated in FIG. 11, providing n pieces of such driving circuits allows clock signals having individual load driving abilities and waveform characteristics to be supplied depending on n pieces of load circuits to be externally connected.

FIG. 12 is a block diagram illustrating the configuration of one driving circuit and peripheral circuits in the oscillator of the present invention shown in FIG. 11. While the driving circuits 73a, 73b, and 73c shown in FIG. 11 are assumed to have different configurations from each other, all of them may have the same configuration. FIG. 12 illustrates one example of the driving circuit 73 shown in FIG. 11. In FIG. 12, the driving circuit 73 includes a voltage control circuit 76 and a buffer circuit 77. The voltage control circuit 76 controls the driving ability of the buffer circuit 77 in accordance with the control data from the control circuit 74. The buffer circuit 77 adjusts, under the control of the voltage control circuit 76, the load driving ability and the waveform characteristics in accordance with the driving ability.

In FIG. 12, the control circuit 74 reads control data Vm written in the memory circuit 75, and controls the voltage control circuit 76 and the buffer circuit 77 by using control data Vcnt. As a result, a clock signal having an output waveform whose load driving ability (amplitude) and waveform characteristics (a duty ratio and slew rate) have been adjusted is output from an output terminal OUT of the buffer circuit 77. In this case, it is necessary to write desired control data Vm in the memory circuit 75 in advance so as to provide a load circuit to be connected to the buffer circuit 77 with an optimum load driving ability (an amplitude) and waveform characteristics (a duty ratio and slew rate).

With the circuit configuration of a driving circuit as shown in FIG. 12, it is possible to vary only the load driving ability and waveform characteristics of an output waveform. Further, it is possible to vary the frequency, as well as the load driving ability and the waveform characteristics, by incorporating a frequency divider and/or a PLL circuit into the driving circuit and by writing the control data Vm, used for setting the frequency-dividing ratio, in the memory circuit 75. That is, the control data Vcnt corresponding to the frequency-dividing ratio written in the memory circuit 75 is used to control the buffer circuit 77 to vary the frequency of a clock signal to be output. This makes it possible to supply a clock signal suitable for the frequency of each functional block.

FIG. 13 is a block diagram illustrating the driving circuit 73b, which has a frequency divider circuit at a stage prior to the buffer circuit, and peripheral circuits in the oscillator of the present invention. As shown in FIG. 13, setting the frequency-dividing ratio of a frequency divider circuit 87 provided at a stage prior to the buffer circuit 77 to N2, and writing the frequency-dividing ratio N2 in the memory circuit 75, allows the control circuit to control the frequency-dividing ratio of the frequency divider circuit 87 in accordance with the frequency-dividing ratio written in the memory circuit 75. Thus, the frequency of the clock signal output from the oscillation circuit 71 is divided by the frequency divider circuit 87 into 1/N2 and is supplied to the buffer circuit 77. In this manner, one oscillator can produce multiple types of oscillation frequencies. The driving circuit in FIG. 13 also can vary the load driving ability and the waveform characteristics of an output waveform, as well as the frequency.

FIG. 14 is a block diagram illustrating the configuration the driving circuit 73c, which has a PLL circuit for multiplying the frequency and a frequency divider, and peripheral circuits in the oscillator of the present invention. The driving circuit 73c shown in FIG. 14 is configured to include a PLL circuit 85 and a frequency divider 86, as well as a voltage control circuit 76 and a buffer circuit 77 which are similar to those in the driving circuit 73a in FIG. 12. The PLL circuit 85 includes a phase comparator 81, an LPF (low pass filter) 82, a VCO (voltage controlled oscillator) 83, and a feedback frequency divider 84. The driving circuit 73c includes a function of multiplying a frequency in the PLL circuit 85 and also a function of dividing the frequency in the frequency divider 86, which thus can provide a wider range for frequency adjustment. Since the PLL circuit 85 is of a known technology, the description of the operation will be omitted.

As in the driving circuit 73c shown in FIG. 14, providing the PLL circuit 85 and the frequency divider 86 at a stage prior to the buffer circuit 77 can vary the frequency of a clock signal to be supplied to the outside from an output terminal OUT of the driving terminal 73c. For example, when the frequency-dividing ratio of the feedback frequency divider 84 in the PLL circuit 85 is N1 and the frequency-dividing ratio of the frequency divider 86 is M, the values of N1 and M are written into the memory circuit 75. Then, in accordance with the N1 and M written in the memory circuit, the control circuit 74 sets the frequency-dividing ratios N1 and M for the corresponding frequency dividers 84 and 86, thereby allowing a clock signal having a desired frequency to be supplied from an output terminal OUT of the buffer circuit 77. Setting a frequency-dividing ratio for each frequency divider allows one oscillator to produce multiple types of oscillation frequencies. Naturally, the driving circuit in FIG. 14 can also vary the load driving ability and the waveform characteristics of an output waveform, as well as the frequency.

FIG. 15 is a block diagram of a circuit in which a standby function is added to the output driving circuit in the oscillator of the present invention. Thus, a standby circuit 88 is added as a standby function to a stage prior to the driving circuit 73. For example, the standby circuit 88 is added to a stage prior to the buffer circuit 77 in the driving circuit 73a in FIG. 12. In FIG. 15, when a clock signal is being supplied from the oscillation circuit 71 to the driving circuit 73 via the standby circuit 88, and when a standby signal BST is externally input to an I/O terminal, the control circuit 74 blocks the gate of the standby circuit 88. As a result, a clock signal for the driving circuit 73 is blocked. For example, the transmitting or stopping of the standby signal, depending on a standby mode or a use mode of a cellular phone, allows the standby circuit 88 to be turned ON or OFF, respectively. Thus, a standby signal is sent to the standby circuit 88 during standby of the cellular phone to stop the operation of the driving circuit (73a, 73b, 73c, . . . ), so that power saving during standby can be achieved.

FIG. 16 is a block diagram illustrating the configuration of a case in which the standby circuit 88 is provided in the multi-output oscillator of the present invention shown in FIG. 11. The output driving circuit (output driving device) 72 in the oscillator 61 shown in FIG. 16 has the plurality of driving circuits (driving device), and clock signals, each having a different frequency, load driving ability, and waveform characteristics, are output from the driving circuit (a first driving device) 73a, the driving circuit (a second driving device) 73b, and the driving circuit (a third driving device) 73c. When the standby signal BST is input from the I/O terminal, the control circuit 74 blocks the gate of the standby circuit 88.

The output driving circuit 72 shown in FIG. 16 has a configuration in which a standby circuit 88a is added to a driving circuit 73a as shown in FIG. 12. Thus, the driving circuit 73a receives an oscillation signal from the oscillation circuit 71 via the standby circuit 88a and supplies a sine-wave clock signal as shown in FIG. 5(a) to the RF section 62 via the output terminal OUT1. Thus, writing desired control data in the memory circuit 75 allows the setting of a desired load driving ability (an amplitude) and waveform characteristics (a duty ratio and slew rate) in the driving circuit 73a. With this arrangement, a clock signal having a load driving ability (an amplitude) and waveform characteristics (a duty ratio and slew rate), which are optimum, can be supplied to the RF section 62 via the output terminal OUT1 of the driving circuit 73a. Further, during standby of a cellular phone, when a standby signal BST is input from an I/O terminal, which is not shown, the control circuit 74 supplies a blocking signal to the standby circuit 88a, which is provided at a stage prior to the driving circuit 73a, thereby stopping the operation of the driving circuit 73a. This leads to power saving during standby of the cellular phone.

Also, the output driving circuit 72 shown in FIG. 16 has a configuration in which a standby circuit 88b is further added to the driving circuit 73b that includes the divider circuit 87 shown in FIG. 13. Thus, the driving circuit 73b receives an oscillation signal from the oscillation circuit 71 via the standby circuit 88b and supplies a rectangular-wave clock signal as shown in FIG. 5(b) to the CPU 63 via the output terminal OUT1. Thus, writing desired control data in the memory circuit 75 allows the setting of a desired load driving ability (an amplitude), waveform characteristics (a duty ratio and slew rate), and a frequency in the driving circuit 73b. With this arrangement, a clock signal having a load driving ability (an amplitude), waveform characteristics (a duty ratio and slew rate), and a frequency, which are optimum, can be supplied to the CPU 63 via the output terminal OUT2 of the driving circuit 73b. When a standby signal is input from the I/O terminal, which is not shown, during standby of the cellular phone, the control circuit 74 supplies a blocking signal to the standby circuit 88b, thereby stopping the operation of the driving circuit 73b. This leads to power saving during standby of the cellular phone.

Also, the output driving circuit 72 shown in FIG. 16 has a configuration in which a standby circuit 88c is further added to the driving circuit 73c that includes the PLL circuit 85 and the frequency divider circuit 86 shown in FIG. 14. Thus, the driving circuit 73c receives an oscillation signal from the oscillation circuit 71 via the standby circuit 88c and supplies a rectangular-wave clock signal as shown in FIG. 5(c) to a digital circuit 89 via the output terminal OUT3. Thus, writing desired control data in the memory circuit 75 allows, under the control of the control circuit 74, the setting of a desired load driving ability (an amplitude), waveform characteristics (a duty ratio and slew rate), and a frequency in the driving circuit 73c. With this arrangement, a clock signal having a load driving ability (an amplitude), waveform characteristics (a duty ratio and slew rate), and a frequency, which are optimum, can be supplied to the digital circuit 89 via the output terminal OUT3 of the driving circuit 73c. When a standby signal is input from the I/O terminal, which is not shown, during standby of the cellular phone, the control circuit 74 supplies a blocking signal to the standby circuit 88c, thereby Stopping the operation of the driving circuit 73c. This leads to power saving during standby of the cellular phone.

In a conventional cellular phone, individual oscillators have been used to supply clock signals to corresponding functional blocks of an RF section, a CPU, digital circuits such as a USB, and MPEG, and an image display section such as an LCD. However, the use of the multi-output oscillator of the present invention can replace the plurality of oscillators by one oscillator to reduce the assembly space, thus allowing for further miniaturization compared to the conventional oscillators. In addition, since the plurality of oscillators are integrated into one oscillator, current consumption is reduced to allow for power saving. Additionally, the oscillation of the oscillator during a standby mode of a cellular phone can be stopped, thereby allowing for further power saving. As a result, the consumption of the battery can be reduced, which makes it possible to achieve a cellular phone that is significantly easy to use.

While the description in the present invention has been given for a case in which one standby circuit 88 is provided for each driving circuit 73, signals to be supplied to three driving circuits 73 can also be blocked simultaneously by blocking the gate of one standby circuit 88. This can reduce a certain number of standby circuits and also can scale down the circuit.

The embodiments described above are examples for illustrating the present invention, and the present invention is not limited to the embodiments. Thus, various variations are possible within the spirit and scope of the present invention. For example, while the description in the third embodiment has been given for a configuration in which the oscillator is molded and sealed, the oscillator may also be configured with a ceramic package 10' in which the one-chip IC 78 and the piezoelectric vibrator 79 are sealed by a lid 80 as shown in FIG. 17.

Further, in FIG. 17, while wire bonding is used to connect the one-chip IC 78 to a substrate, flip chip bonding (FCB) may be used instead. While the description has been given for the oscillator using three types of oscillation circuits, i.e., a crystal oscillation circuit, voltage controlled crystal oscillation circuit, and a temperature compensated crystal oscillation circuit, the oscillator of the present invention is not limited thereto. For example, the oscillation circuit may be an RC oscillation circuit constituted by resistors and capacitors or may be an LC oscillation circuit constituted by inductance and capacitors.

While the description in the oscillation circuit in each embodiment has been given for a case in which a crystal vibrator is used as the oscillation source in the present invention, the present invention is not limited thereto. For example, a vibrator made of a piezoelectric ceramic, lithium tantalate, lithium niobate, or the like may be used. Additionally, the use of a surface acoustic wave resonator (SAW resonator) can also provide the same advantages.

Advantages

As described above, according to the oscillator of the present invention, to provide waveform characteristics of an output waveform in accordance with a user-designated, predetermined specifications, control data for controlling the voltage control circuit and the driving-ability adjusting section is pre-stored in the memory, and waveform characteristics of the output amplitude, duty ratio, rising time, and falling time of an output waveform desired by the user are adjusted, in accordance with the stored control data. With this arrangement, unlike in a conventional case, there is no need to redundantly develop and manufacture various types of ICs in accordance with user's specifications in a developing process. Thus, desired control data may be written in the memory in accordance with user's specifications, by preparing an oscillator configured with one type of IC. In addition, there is no need to manufacture a plurality of oscillators depending on user's specifications. Thus, manufacturing only one type of oscillator can provide output signals desired by the user from the buffer circuits of the oscillator, thus significantly simplifying the manufacturers production control and inventory control.

In addition, even if manufacturing variations in transistors included in the oscillator or waveform variations in an output signal due to connection of a user's load circuit to the oscillator occurs, taking the factors into account in advance to adjust the output waveform to have a desired duty ratio can provide a duty ratio as designed and desired by the user.

Additionally, the oscillator of the present invention can be a multi-output oscillator, and thus can output clock signals, each having different waveform characteristics of a waveform, such as a duty ratio and slew rate representing a rising/failing characteristic, and a different amplitude, from corresponding output terminals. Thus, one oscillator can send desired clock signals to corresponding different functional blocks of a cellular phone, such as an RF section, CPU, digital circuit, and image display section. Furthermore, only software processing, i.e., writing desired control data in the storing device allows a clock signal having waveform characteristics, amplitude, and frequency, which are optimum, to be sent to a chip set for each function from the multi-output oscillator. Thus, preparing a common oscillator and only re-writing the control data can achieve an oscillator that has been customized, thus significantly simplifying the oscillator inventory control. In addition, since one oscillator can send individual clock signals to multi-functional chip sets, it is possible to further reduce the assembly space compared to a conventional oscillator. In addition, since the integration into one oscillator reduces current consumption, power saving can be achieved.

What is claimed is:

1. An oscillator including an oscillation circuit for outputting a signal having an oscillation waveform at a predetermined frequency, and an output driving device for receiving the signal having the oscillation waveform and outputting a clock signal having an output waveform with desired waveform characteristics, the output driving device comprising:

a storing device for storing control data that adjusts waveform characteristics of the output waveform;

a controlling device for extracting the control data stored in the storing device and outputting the control data for adjusting the waveform characteristics of the output waveform;

a voltage controlling device for generating and outputting, upon input of a first power-supply voltage, a second power-supply voltage that defines an output amplitude of the output waveform in accordance with the control data; and a buffer circuit for adjusting, upon input of the signal having the oscillation waveform and the second power-supply voltage, the waveform characteristics of the output waveform in accordance with the control data, and outputting a clock signal; comprises:

an output device for outputting, upon input of the signal having the oscillation waveform and the second power-supply voltage, the clock signal having an adjusted output amplitude of the output waveform;

a plurality of driving-ability adjusting devices for adjusting, upon input of the signal having the oscillation waveform and the second power-supply voltage, the waveform characteristics of the output waveform in accordance with the control data, and outputting clock signals; and a switching device for selecting the clock signals output from the corresponding driving-ability adjusting device, in accordance with the control data;

wherein, the switching device is operated in accordance with the control data to adjust the waveform characteristics of the output waveform.

2. The oscillator according to claim 1, wherein, in accordance with the control data, at least one of the driving-ability adjusting devices and the corresponding switching device of the buffer circuit are simultaneously operated.

3. An oscillator including an oscillation circuit for outputting a signal having an oscillation waveform at a predetermined frequency, and an output driving device for receiving the signal having the oscillation waveform and outputting a clock signal having an output waveform with desired waveform characteristics, the output driving device comprising:

a storing device for storing control data that adjusts waveform characteristics of the output waveform;

a controlling device for extracting the control data stored in the storing device and outputting the control data for adjusting the waveform characteristics of the output waveform;

a voltage controlling device for generating and outputting, upon input of a first power-supply voltage, a second power-supply voltage that defines an output amplitude of the output waveform in accordance with the control data; and a buffer circuit for adjusting, upon input of the signal having the oscillation waveform and the second power-supply voltage, the waveform characteristics of the output waveform in accordance with the control data, and outputting a clock signal;

wherein, in accordance with the control data supplied from the storing device, the voltage controlling device generates the second power-supply voltage by selecting a plurality of resistors included in the voltage controlling device.

4. The oscillator according to claim 1, wherein the output driving device includes a plurality of driving devices which are comprised of the voltage controlling device and the buffer circuit, for outputting clock signals, each driving device having an output waveform with desired waveform characteristics; and wherein, in accordance with the control data stored in the storing device, the controlling device causes each driving device to output a clock signal having an output waveform with desired waveform characteristics.

5. The oscillator according to claim 4, wherein at least one of the plurality of driving devices includes a frequency divider circuit for dividing the frequency of the clock signal to be output.

6. The oscillator according to claim 4, wherein at least one of the plurality of driving devices includes a PLL circuit for multiplying the frequency of the clock signal to be output.

7. The oscillator according to claim 4, wherein the output driving device further comprises a standby circuit for blocking an oscillation signal supplied from the oscillation circuit.

8. The oscillator according to claim 4, wherein the plurality of driving devices included in the output driving device further comprise:

a first driving device for outputting, in accordance with the control data stored in the storing device, a clock signal having an output waveform with desired waveform characteristics;

a second driving device for outputting, in accordance with the control data stored in the storing device, a clock signal having an output waveform with desired waveform characteristics, the second driving device including a PLL circuit for multiplying the frequency of the clock signal;

a third driving device for outputting, in accordance with the control data stored in the storing device, a clock signal having an output waveform with desired waveform characteristics, the third driving device including a frequency divider circuit for dividing the frequency of the clock signal; and standby circuits for blocking oscillation signals supplied to each of the first, second, and third driving devices from the oscillation circuit.

9. An electronic device including the oscillator according to claim 1, wherein the electronic device operates in accordance with the clock signal output from the oscillator.

* * * * *

UNITED STATES PATENT AND TRADEMARK OFFICE
CERTIFICATE OF CORRECTION

PATENT NO. : 6,927,641 B2  Page 1 of 1
APPLICATION NO. : 10/281889
DATED : August 9, 2005
INVENTOR(S) : Katsuyoshi Terasawa and Manabu Oka It is certified that error appears in the above-identified patent and that said Letters Patent is hereby corrected as shown below:

| | |
|---|---|
| Title Page, (57) ABSTRACT, col. 2 Line 6: | "with control data" should be -- having an -- |
| Column 8, Line 40: | "transistor)." should be -- transistor"). -- |
| Column 9, Line 5: | "$\tilde{=}$" should be -- = -- |
| Column 13, Line 16: | "a" should be -- an -- |
| Column 15, Line 35: | "OUT 3" should be -- OUT3 -- |
| Column 18, Line 47: | "Stopping" should be -- stopping -- |
| Column 19, Line 55 | "manufacturers" should be -- manufacturer's -- |
| Column 19, Line 67: | "rising/failing" should be -- rising/falling -- |
| Column 20, Line 40: | before "comprises:" insert -- wherein the buffer circuit further -- |

Signed and Sealed this

Twenty-second Day of August, 2006

JON W. DUDAS
*Director of the United States Patent and Trademark Office*